(12) United States Patent
Franklin et al.

(10) Patent No.: US 7,601,961 B2
(45) Date of Patent: Oct. 13, 2009

(54) X-RAY IMAGE DETECTOR

(75) Inventors: Anthony Roy Franklin, East Grinstead (GB); Martin John Powell, Kendal (GB); Michael Overdick, Langerwehe (DE); Augusto Nascetti, Rome (IT); Walter Ruetten, Linnich (DE); Tiemen Poorter, Eindhoven (NL); Lex Alving, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 211 days.

(21) Appl. No.: 11/570,604

(22) PCT Filed: Jun. 9, 2005

(86) PCT No.: PCT/IB2005/051907

§ 371 (c)(1),
(2), (4) Date: Dec. 14, 2006

(87) PCT Pub. No.: WO2005/124866

PCT Pub. Date: Dec. 29, 2005

(65) Prior Publication Data

US 2007/0211858 A1    Sep. 13, 2007

(51) Int. Cl.
*H05G 1/64* (2006.01)

(52) U.S. Cl. .................... 250/370.09; 378/98.8

(58) Field of Classification Search ............ 250/370.09, 250/370.14; 378/98.8
See application file for complete search history.

(56) References Cited

U.S. PATENT DOCUMENTS

| | | | |
|---|---|---|---|
| 4,679,088 A * | 7/1987 | Chiyoma et al. | ............ 358/482 |
| 5,574,765 A | 11/1996 | Hassler et al. | |
| 5,610,404 A | 3/1997 | Possin | |
| 5,770,871 A | 6/1998 | Weisfiled | |
| 5,929,449 A | 7/1999 | Huang | |
| 6,404,851 B1 | 6/2002 | Possin et al. | |
| 2001/0010352 A1* | 8/2001 | Teranuma et al. | ........ 250/208.1 |

FOREIGN PATENT DOCUMENTS

| | | |
|---|---|---|
| EP | 1069439 A | 1/2001 |
| WO | 200225314 A | 3/2002 |
| WO | 03100459 A1 | 12/2003 |

* cited by examiner

*Primary Examiner*—David P Porta
*Assistant Examiner*—Mark R Gaworecki

(57) ABSTRACT

An Y-ray detector apparatus comprises an array of detector pixels arranged into a plurality of sub-arrays. The pixels in each sub-array share a common dose sensing output provided to a dose sensing output conductor which extends to a periphery of the pixel array. The dose sensing output conductor for one sub-array of pixels passes through the area occupied by another sub-array of pixels, which can lead to unwanted cross talk. The invention provides a plurality of additional screening electrodes, with a screening electrode substantially adjacent the dose sensing output conductor for each sub-array of pixels. These screening electrodes reduce cross talk between the dose sensing output and other pixel electrodes. In another arrangement, each pixel further comprises a pixel electrode for each pixel formed at an upper region of the array, and the dose sensing output conductors are formed at a lower region of the array. An intermediate conductor layer is then provided which overlaps the dose sensing output conductors for other sub-arrays of pixels and which pass through the area occupied by the sub-array of pixels.

29 Claims, 27 Drawing Sheets

X-RAY IMAGE DETECTOR

The invention relates to an X-ray detector and to an X-ray examination apparatus, which uses the detector. In particular, the detector is for providing image signals as well as exposure control signals by having exposure measurement circuitry integrated with solid state X-ray detector circuitry. This enables real time control of the X-ray exposure during an image acquisition process.

It is well known that the X-ray exposure of a patient should be controlled as a function of the absorptivity of the tissue under examination. For example, overexposed areas of high brightness may occur in the image, for example caused by X-rays which are not (or only hardly) attenuated by the object to be examined, for example a patient. Tissue having a low X-ray absorptivity, for example lung tissue, will provide less attenuation and therefore requires less X-ray exposure to obtain an image of given contrast and to prevent saturation of the image detector.

Configurations of known X-ray examination apparatus are well known to those skilled in the art. Typically, the apparatus includes an X-ray source for irradiating a patient to be radiologically examined, by means of an X-ray beam. Due to local differences in the X-ray absorptivity within the patient, an X-ray image is formed. The X-ray detector derives an image signal from the X-ray image. In a detector using an optical sensor, the detector has a conversion layer or surface for converting the incident X-ray energy into optical signals. In the past, these optical signals have largely been detected by an image intensifier pick-up chain, which includes an X-ray image intensifier and a television camera.

More recently, the use of a solid state X-ray detectors has been proposed. There are two basic configurations for such devices.

In a so-called "indirect" detector arrangement, the incident X-ray radiation is first converted into light. An array of photosensitive cells is provided, each comprising a light-sensitive element (photodiode), and a charge storage device (which may be a separate element or it may be the self-capacitance of the photodiode).

In a so-called "direct" detector arrangement, an X-ray sensitive photoconductor is used to convert the X-rays directly into electrons. Since the photoconductor has no self-capacitance, a capacitor is fabricated by thin film techniques to act as a charge storage device.

During X-ray exposure, the light incident on each cell is stored as a level of charge on the charge storage device, to be read out at the end of the exposure period. The read out of charges stored effectively resets the image sensor, so this can only be carried out at the end of the X-ray exposure period. Thus, it is not possible to use the output signals from an image sensor of this type to control the exposure period in real time, because such outputs are only available at the end of exposure.

One possible way to achieve dose control is to analyse the obtained image, and then to repeat the image acquisition process with a different exposure level. Of course, this increases the overall exposure of the patient to potentially harmful X-ray radiation, and is also not appropriate for rapidly changing images, or where images from different viewpoints are required in rapid succession.

External dose sensing arrangements have been proposed which are independent of the solid state image detector, but these can degrade the image quality.

It has also been proposed to combine dose sensing elements into the normal image sensing pixel layout. When charges are generated in the pixel, a dose sensing signal is generated, and this signal can be detected without reading the signals stored on the pixel signal charge storage device.

A first example of integrated dose sensing system is described in WO 02/25314. In some embodiments, the additional dose sensing element is an additional tapping capacitor, and the charge flow is detected as the capacitor voltage changes. In other examples, the additional dose sensing element is a transistor, and the pixel voltage is applied to the gate of the drive transistor. In this case, the additional transistor acts as a current source, and this current is measured.

A second example of dose sensing system is described in WO 03/100459. In this case, the additional dose sensing element is an additional transistor, but it is the off-capacitance of the transistor which is used to tap a part of the signal, and capacitive coupling is essentially used to provide a dose sensing signal.

In both of the examples above, the dose sensing function is performed with a lower resolution than the image sensing function. For this purpose, the pixels are divided into sub-arrays, and each sub-array provides a single dose sensing output, but each pixel of the sub-array provides an individual image sensor output.

One problem with these known integrated dose sensing systems is the cross talk between different dose sensing signals. This cross talk results from capacitive coupling between pixel electrodes and the readout line used to read out a dose sensing signal (from other pixels).

According to the invention, there is provided an X-ray detector apparatus comprising an array of detector pixels, each pixel comprising a conversion element for converting incident radiation into a charge flow, a charge storage element and a switching arrangement enabling the charge stored to be provided to an output of the pixel, wherein the array of pixels is arranged into a plurality of sub-arrays, each sub array comprising a plurality of pixels, the pixels in each sub-array sharing a common dose sensing output provided to a dose sensing output conductor which extends to a periphery of the pixel array, wherein the dose sensing output conductor for one sub-array of pixels passes through the area occupied by another sub-array of pixels, wherein a plurality of additional screening electrodes are provided, with a screening electrode substantially adjacent the dose sensing output conductor for each sub-array of pixels.

These screening electrodes reduce cross talk between the dose sensing output and other pixel electrodes. In particular, the dose sensing output passes through the area occupied by pixels not associated with the dose sensing output, and cross talk introduced by these pixels is reduced.

The screening electrodes are preferably formed from the same process layer or layers as the dose sensing output conductors. In this way, they do not complicate the manufacturing process. Each dose sensing output conductor can be sandwiched between a screening electrode and a further electrode, with the dose sensing output conductor, screening electrode and further electrode being parallel to each other and formed from the same process layer or layers.

The pixels are preferably arranged in rows and columns, and the dose sensing output conductors extend in a column direction. The dose sensing output conductors may also function as the image sensor data output conductors. This is appropriate for pixels in which a switching arrangement of each pixel enables a multiplexing function with the pixel sub-array to be implemented.

In another arrangement, the dose sensing output conductors extend in a row direction and separate detector data output conductors extend in a column direction. This is appropriate for pixels in which capacitive coupling is provided to a separate dose sensing line.

The screening electrodes may all be electrically connected together, for example outside the pixel array.

In pixel designs having the multiplexing function, the detector apparatus is operable in two modes, a first mode in which charge flow in response to incident radiation is partially coupled to the dose sensing output for measurement as a dose sensing signal, and a second mode in which charge flow is coupled through a pixel switching arrangement between the charge storage element and the dose sensing output for measurement as a detection signal, and wherein the switching arrangement is turned on by first and second control signals which enable a single pixel within the sub-array to be selected.

In this arrangement, a common output is used for dose sensing during exposure, and the dose sensing is performed with a resolution corresponding to the size of the sub-arrays. The number of read out amplifiers can then be reduced to one per sub-array of pixels.

A pixel electrode for each pixel is typically formed at an upper region of the array, and the dose sensing output conductors can be formed at a lower region of the array (for example from the metal layer for the pixel transistor gate). Each pixel may then further comprise an intermediate conductor layer which overlaps the dose sensing output conductors for other sub-arrays of pixels which pass through the area occupied by the sub-array of pixels. This provides an additional level of screening.

The intermediate conductor layer can be formed from a layer which also forms the detector output conductors, so that this additional screening layer also does not introduce additional processing layers.

According to a second aspect of the invention, there is provided an X-ray detector apparatus comprising an array of detector pixels, each pixel comprising a conversion element for converting incident radiation into a charge flow, a charge storage element and a switching arrangement enabling the charge stored to be provided to an output of the pixel, wherein the array of pixels is arranged into a plurality of sub-arrays, each sub array comprising a plurality of pixels, the pixels in each sub-array sharing a common dose sensing output provided on a dose sensing output conductor which extends to a periphery of the pixel array, wherein the dose sensing output conductor for one sub-array of pixels passes through the area occupied by another sub-array of pixels, wherein each pixel further comprises a pixel electrode for each pixel formed at an upper region of the array, and the dose sensing output conductors are formed at a lower region of the array, wherein each pixel further comprises an intermediate conductor layer which overlaps the dose sensing output conductors for other sub-arrays of pixels and which pass through the area occupied by the sub-array of pixels.

The X-ray detector of the invention is preferably used for receiving an X-ray image from an X-ray source after attenuation by an object to be examined.

Examples of the invention will now be described in detail with reference to the accompanying drawings, in which.

Figure 1:
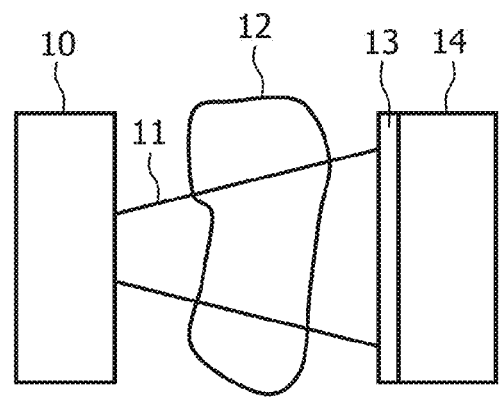
FIG. 1 shows a known X-ray examination apparatus.

FIG. 1 shows a known X-ray examination apparatus which includes an X-ray source 10 for irradiating an object 12 to be examined, for example a patient to be radiologically examined, by means of an X-ray beam 11. Due to local differences in the X-ray absorption within the patient, an X-ray image is formed on an X-ray-sensitive surface 13 of the X-ray detector 14.

One known design of X-ray detector 14 uses a solid state optical image sensor. The incident X-ray radiation is converted into light using a phosphor scintillator 13. This light can be detected by the solid-state device 14. Alternatively, an X-ray sensitive photoconductor can be used to convert the X-rays directly into electrons.

Figure 2A:
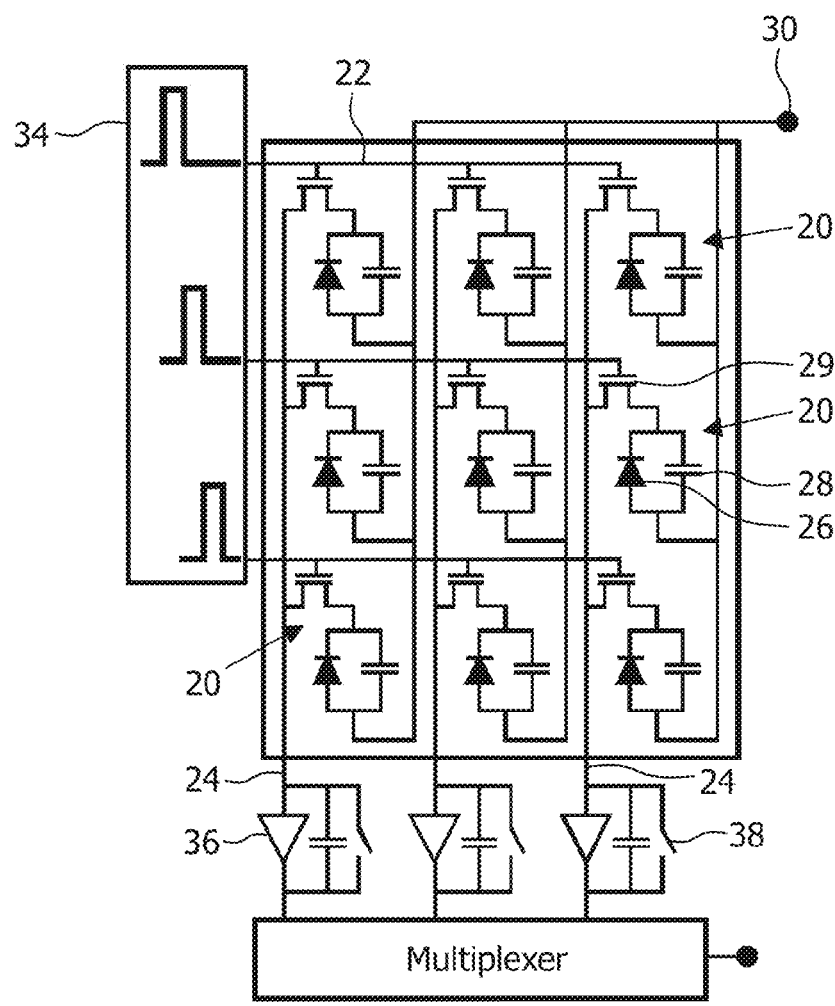
FIG. 2A shows a first known pixel layout for a solid state image sensor used in the apparatus of FIG. 1.

FIG. 2A shows one known design for the solid state optical image sensor. The sensor comprises an array of pixels 20 arranged in rows and columns. Rows of pixels share a row address line 22, and columns of pixels share a readout line 24. Each pixel comprises a photodiode 26 in parallel with a charge storage capacitor 28. This capacitor 28 may be a separate component, or else it may simply comprise the self-capacitance of the photodiode 26. This parallel combination is connected in series with a thin film transistor 29 between a common electrode 30 and the column readout line 24 for that particular pixel. The pixel array is provided on a glass substrate 32. Row driver circuitry 34 provides signals for the row address lines 22, and the column readout lines 24 provide an output from the substrate 32, and each column readout line 24 is associated with a respective charge sensitive amplifier 36.

The function of the photodiode is to convert the incident radiation into a flow of charge which alters the level of charge stored on the capacitor.

Figure 2B:
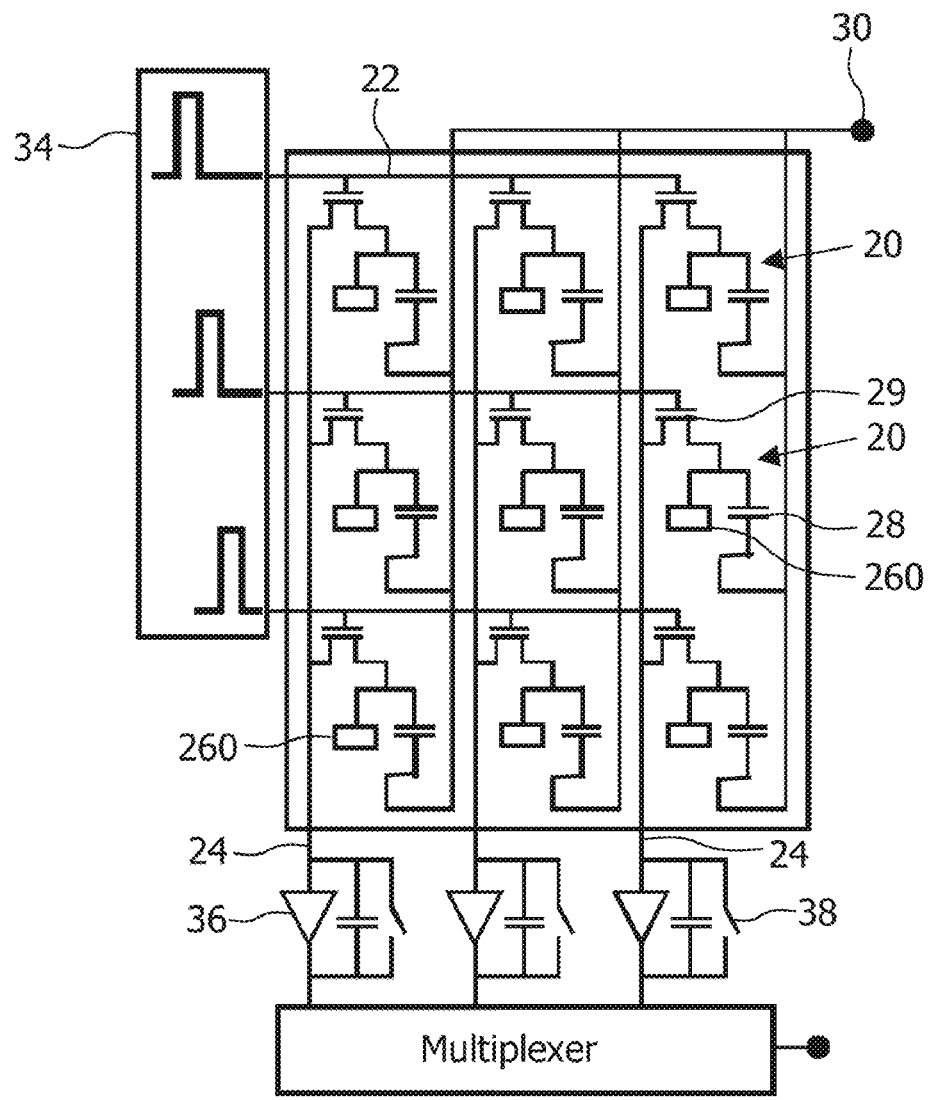
FIG. 2B shows a second known pixel layout for a solid state image sensor used in the apparatus of FIG. 1.

FIG. 2B shows a known design of solid state direct X-ray detector. The same references are used as in FIG. 2A for the same components. In the case of direct conversion of the radiation using a photoconductor, the capacitor 28 is implemented as a separate thin film component, and again the level of charge stored is a function of the flow of charge from the photoconductor. The photoconductor and capacitor effectively replaces the phosphor conversion layer and photodiode in the arrangement of FIG. 2A, and the photoconductor 260 is biased to a suitable operating voltage.

In operation of the image sensor devices above, the capacitors 28 are all charged to an initial value. This is achieved by the previous image acquisition or else may be achieved with an initial reset pulse on all row conductors 22. The charge sensitive amplifiers are reset using reset switches 38.

During X-ray exposure, for the indirect conversion case, light incident on the photodiodes 26 causes charge to flow in the reverse-bias direction through the photodiodes. This current is sourced by the capacitors 28 and results in a drop in the voltage level on those capacitors. Alternatively, for the direct conversion case, the charge flow through the photoconductor 260 drains the charge from the capacitors 28.

At the end of X-ray exposure, row pulses are applied to each row conductor 22 in turn in order to switch on the transistors 29 of the pixels in that row. The capacitors 28 are then recharged to the initial voltage by currents flowing between the common electrode 30 and the column readout lines 24 and through the transistor switches. In the example shown, these currents will be sourced by the charge sensitive amplifiers 36, rather than flow to them. The amount of charge required to recharge the capacitors 28 to the original level is an indication of the amount of discharge of the storage capacitor 28, which in turn is an indication of the exposure of the pixel to incident radiation. This flow of charge is measured by the charge sensitive amplifiers. This procedure is repeated for each row to enable a full image to be recovered.

A problem with the use of solid-state image sensors of this type is that a pixel signal is only obtained during the read out stage, after the exposure has been completed. As will be apparent from the above description, any read out of signals results in recharging of the pixel capacitors 28, and effectively resets those pixels. Therefore, it is not possible to take samples during the image acquisition process, and the image sensor design does not therefore allow real-time exposure measurements to be obtained.

Figure 3:
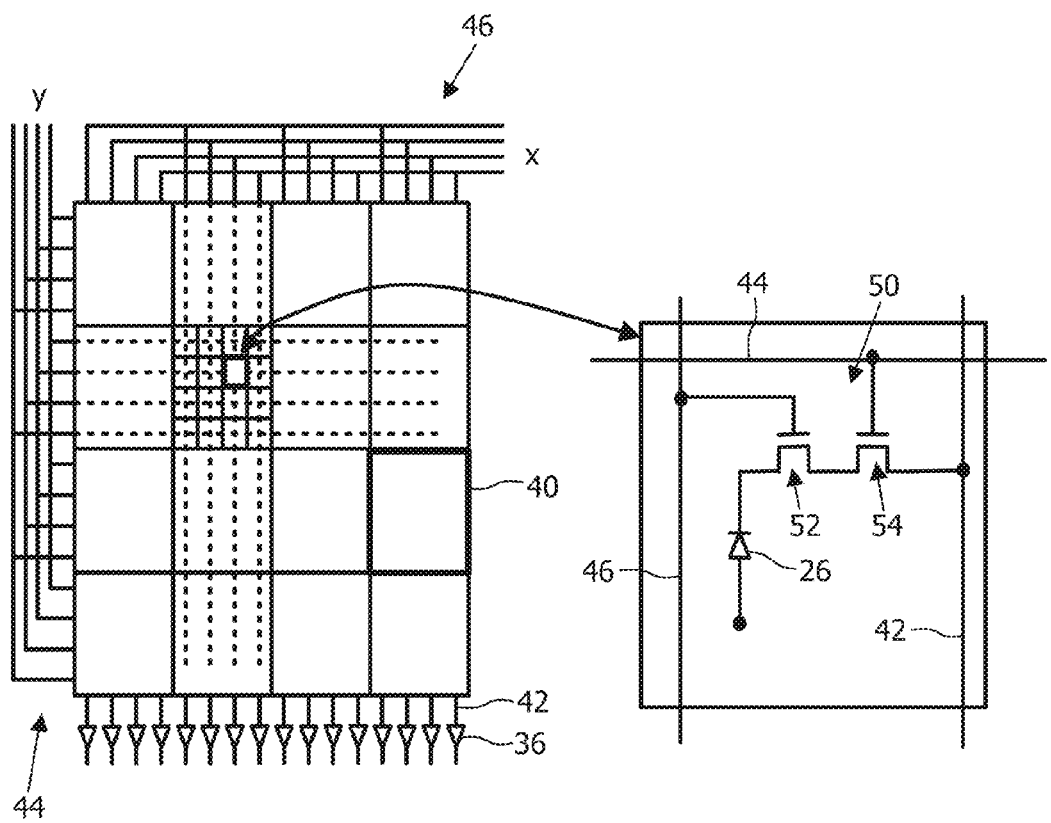
FIG. 3 shows a first known pixel arrangement with dose sensing capability.

FIG. 3 shows a first known pixel providing an integrated dose sensing function.

As shown in FIG. 3, the detector has an array of detector pixels which is arranged into a plurality of sub-arrays 40. Each sub-array 40 comprises a plurality of pixels also arranged in rows and columns. The pixels in each sub-array share a common output 42, and there is one read-out amplifier 36 associated with each common output. During read out of the device, one pixel from each sub-array is read out simultaneously. In order to select an individual pixel from each sub array 40, each pixel is associated with a row control line 44 and a column control line 46. The row control lines 44 form a set of control lines which are shared between the different sub-arrays 40, and similarly the column control lines 46 form a set of control lines which are shared between the different sub-arrays 40. The number of control lines in set 44 corresponds to the number of rows in each sub-array and the number of control lines in set 46 corresponds to the number of columns in each sub-array.

FIG. 3 shows one pixel in enlarged form. As for the more conventional pixel configuration, each pixel has a conversion element 26 for converting incident radiation into a charge flow, a charge storage element which may be the intrinsic self-capacitance, and a switching arrangement 50 enabling the charge stored to be provided to the output 42 of the pixel.

The switching arrangement 50 is able to select an individual pixel within a sub-array 40 by using two control signals, namely the signals on the row and column control lines 44,46.

In the example of FIG. 3, the switching arrangement 50 comprises first and second thin film transistors 52, 54 in series between the conversion element and the output 42. The first transistor 52 is gated by a column select control signal on the column control line 46, and the second transistor 54 is gated by a row select control signal on the row control line 44. In this way, the two transistors 52, 54 provide an "AND" function so that an individual pixel within the two dimensional sub-array 40 may be selected. During read out, an individual pixel is recharged by charge flow between the output 42 and the photodiode 26, so that the resolution of the read out is per-pixel.

This pixel configuration also enables a dose sensing output to be provided during exposure. Thus, the detector is operable in two modes. In a first mode, which is the exposure mode, the switching arrangement 50 is turned off and charge flow in response to incident radiation is partially coupled through the source-drain capacitance of the two transistors 52, 54, which are both turned off. The way in which this capacitive coupling can provide a dose sensing signal which does not destroy the read out signal will now be described.

The voltage on the pixel capacitor 28 is again preset to a known level before the image acquisition process. During X-ray exposure, the photodiode 26 provides a flow of charge which is proportional to the dose incident on the pixel. Part of this charge is stored on the pixel capacitor, while the other part flows on to the off-capacitance of the switching arrangement 50. This causes a corresponding flow of charge along the read out line 42. The charge sensitive amplifier 36 measures this flow of charge. All pixels in a sub-array 40 are associated with the signal read out line 42, so that the charge flow is summed for all pixels in the sub-array, and the resolution of the dose sensing signal is per sub-array rather than per pixel. The charge sensitive amplifier 36 maintains a fixed potential at its input, so that cross talk from one pixel cell to another does not arise.

At the end of the X-ray exposure, the pixels are read out in conventional way by switching on the switching arrangement to allow a charge to flow along the readout line 42 which recharges the pixel capacitor 28. The is the second mode of operation. However, charge also flows to the off-capacitance of the switching arrangement 50, so that charges flowing to or from this off-capacitance during X-ray exposure are not lost, but are recovered when the image read out process takes place.

The off-capacitance is significantly smaller than the pixel capacitor, so that the dose sensing signal (which is effectively a charge leakage across the turned off transistors) is relatively small. The transistor designs will be selected to provide appropriate levels of this capacitance. The summing of these signals for a group of pixels assists in measurement of the charge flow, but enables only a small increase in switching noise during pixel read out.

This pixel configuration enables the number of read out amplifiers to be reduced to one per sub-array of pixels, and this is achieved by having multiplexing in the pixels. The same common output is used for read out of individual pixel signals as for dose sensing of a sub-array of pixels, so that the resolution of the detector is not reduced. The switching arrangement enables the same output to be used for dose sensing and conventional read out by providing capacitive coupling to the read out line when the switching arrangement is turned off, and providing direct conductive coupling when the switching arrangement is turned on.

Figure 4:
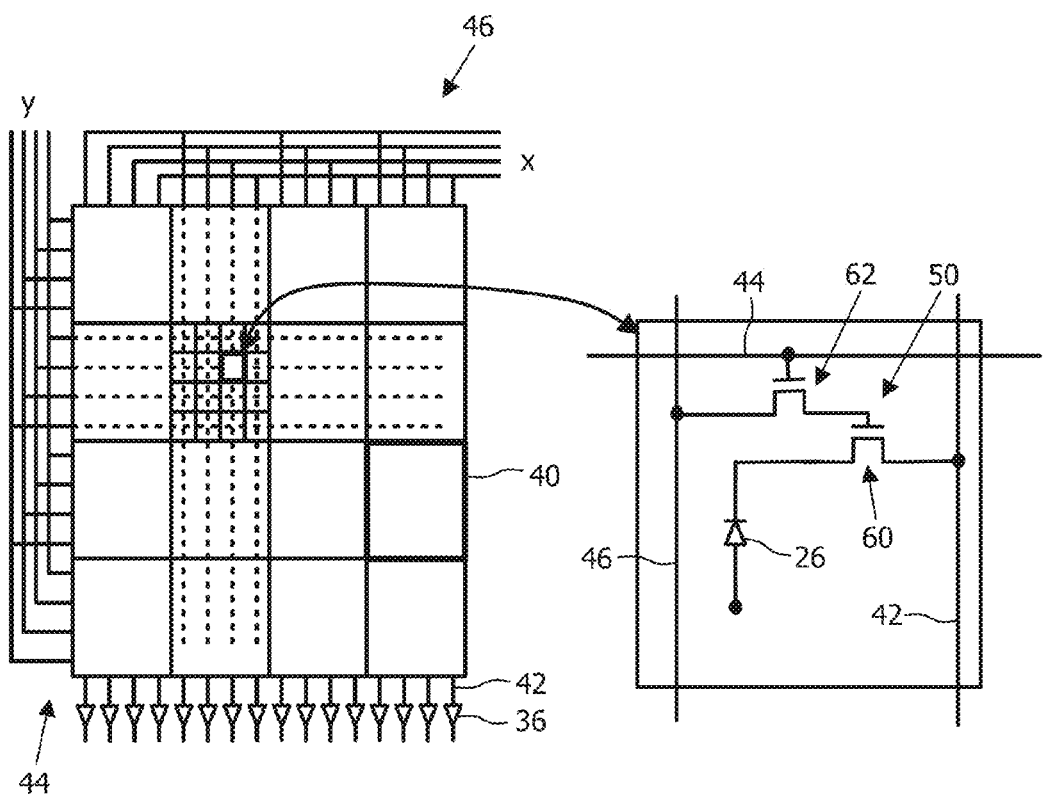
FIG. 4 shows a second known pixel arrangement with dose sensing capability.

FIG. 4 shows an alternative pixel layout. The operation is the same as for the example of FIG. 3, but the switching arrangement 50 has a different design. The switching arrangement 50 has a first thin film transistor 60 in series between the photodiode 26 and the output 42 and a second thin film transistor 62. The second thin film transistor 62 is gated by the row select control signal from the row control signal line 44 and switches the column select control signal from the column control signal line 46 to the gate of the first transistor 60. In this way, the second transistor 62 alone provides the "AND" function. When the second transistor 62 is turned off (during X-ray exposure in the first mode), the gate of the first transistor 60 forms a floating node. This increases the source-drain capacitance of the first transistor 60 when compared with the arrangement of FIG. 3, in which the transistors 52, 54 are actively turned off. This increase in the source-drain capacitance improves the sensitivity of the pixel for the dose sensing operation.

Figure 5:
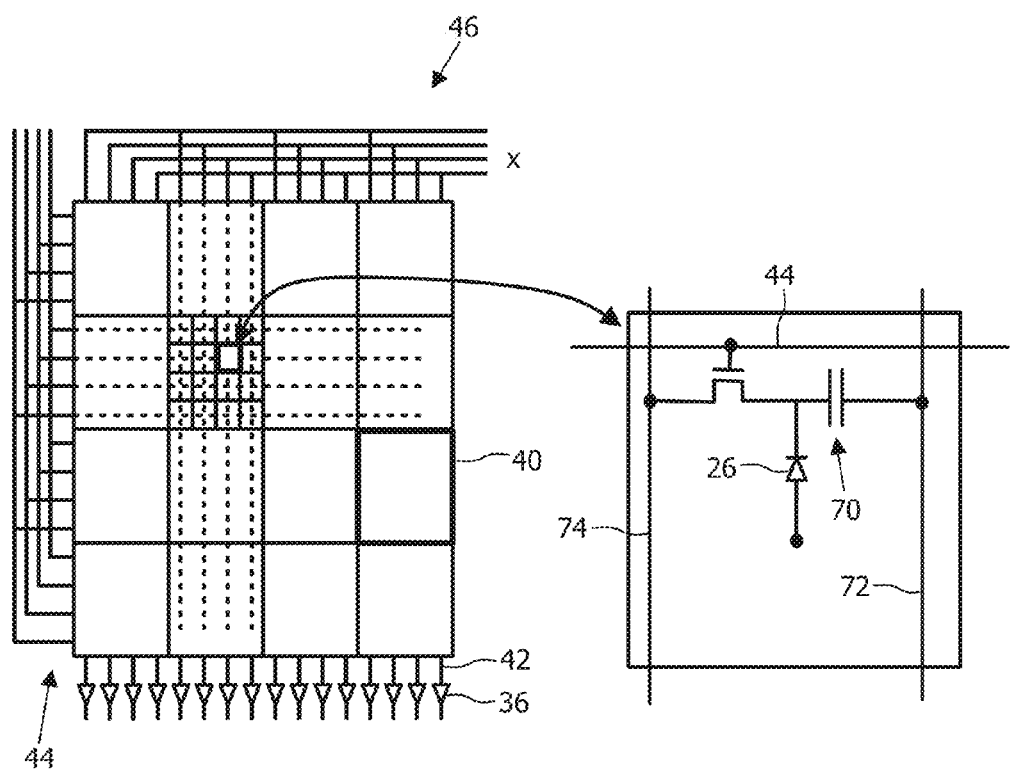
FIG. 5 shows a third known pixel arrangement with dose sensing capability.

FIG. 5 shows another alternative pixel layout. Each pixel includes a tapping capacitor 70 which provides capacitive coupling of the photodiode voltage to a dose sensing line 72, which is separate to the normal output 74. This configuration requires two output connections to each pixel, but only requires one transistor, which thus reduces the number of control inputs required to the pixel. This pixel has two output column lines and one row control line, instead of one output column line, one row control line and one column control line.

Figure 6:
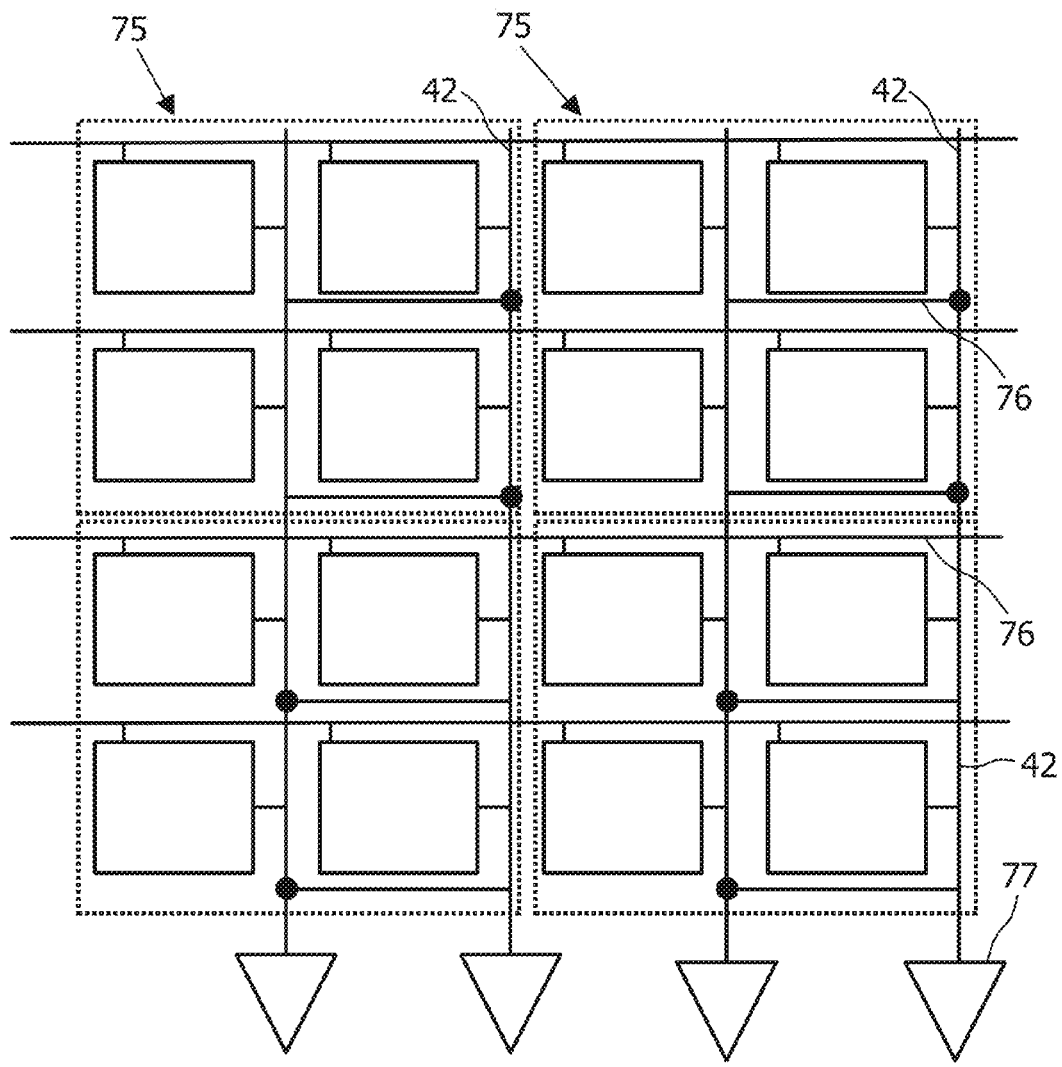
FIG. 6 shows how the pixels can be grouped into sub-arrays in known manner to provide shared dose sensing outputs.

FIG. 6 shows in simplified from how the sub-array dose sensing outputs are provided to external measurement circuitry, for the examples where the dose sensing output is provided on the same conductor as the pixel outputs.

In FIG. 6, the control lines 46 are not shown. The combined pixel and dose sensing outputs are shown as 42. Within a sub-array 75 of pixels, all the pixel outputs are connected to one of the output lines 42 and which has its own read out amplifier 77. Within each sub-array 75, internal connections 76 are made to the common output line. Each output line 42 passes through other pixel sub-arrays, and the pixels in these other sub-arrays do not connect to the line 42. This causes a problem of cross talk between the pixel signals in one sub-array and the output line for another sub-array which passes through.

The same problem arises in the tapping capacitor examples of FIG. 5 as well as the where different conductors are provided for the dose sensing signals and the output signals, as well as to the examples where the output lines are shared.

X-ray detectors can be realised in several different technologies, all of which are of interest in medical image sensors and applicable to this invention. FIGS. 7 to 23 show cross-sections and plan views of the main technologies of interest for medical image sensors, for known pixel configurations. These figures are simply provided to show the range of technologies available, and which may be used for implementing the invention. Some of the figures show standard pixel configurations (without integrated dose sensing) and some show pixel configurations with integrated dose sensing. The specific layers in these cross sections will not be described in detail, as the details will be known to those skilled in the art. FIGS. 7 to 23 are also used to illustrate the problem with the known integrated dose sensing 7 pixel layouts outlined above.

Figure 7:
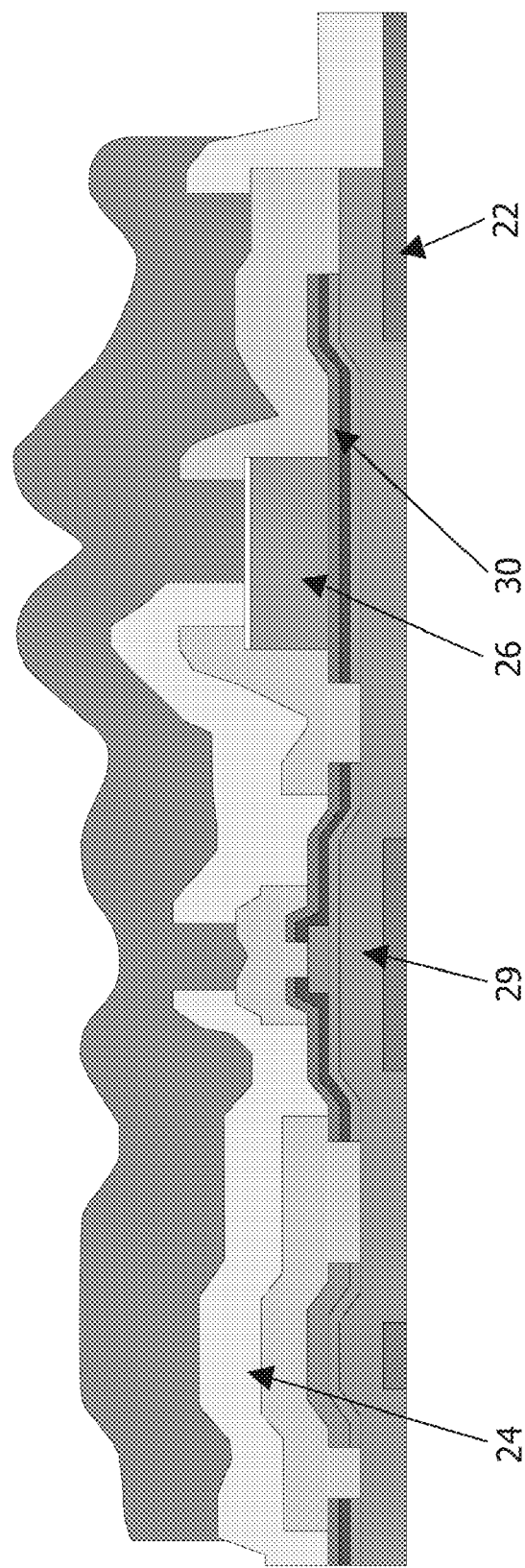
FIGS. 7 to 23 show in cross section and in plan view various known technologies implementing solid state image sensors, and which may be employed to implement the invention.
Figure 8:
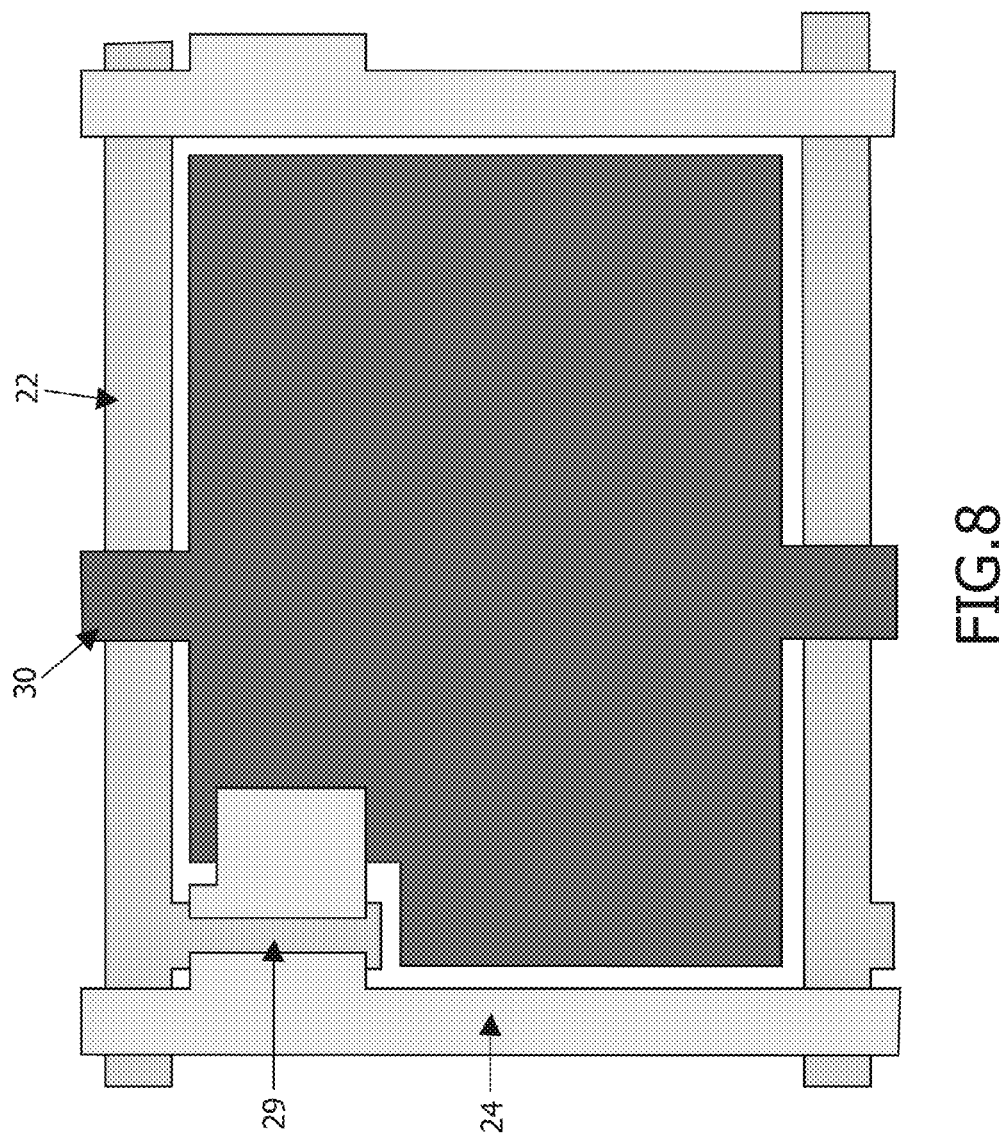

FIG. 7 shows in cross section a planar photodiode-TFT pixel and FIG. 8 shows the pixel layout in plan view. In this design, the photodiode is beneath the pixel electrode, and the photodiode is built over the source/drain metal layer. In this design, the connection between the photodiode and the TFT source or drain is with the top photodiode contact, and the bottom contact of the photodiode is the common contact for all photodiodes. FIGS. 7 and 8 show the photodiode 26, data line 24, TFT 29, common electrode 30 and gate line 22.

Figure 9:
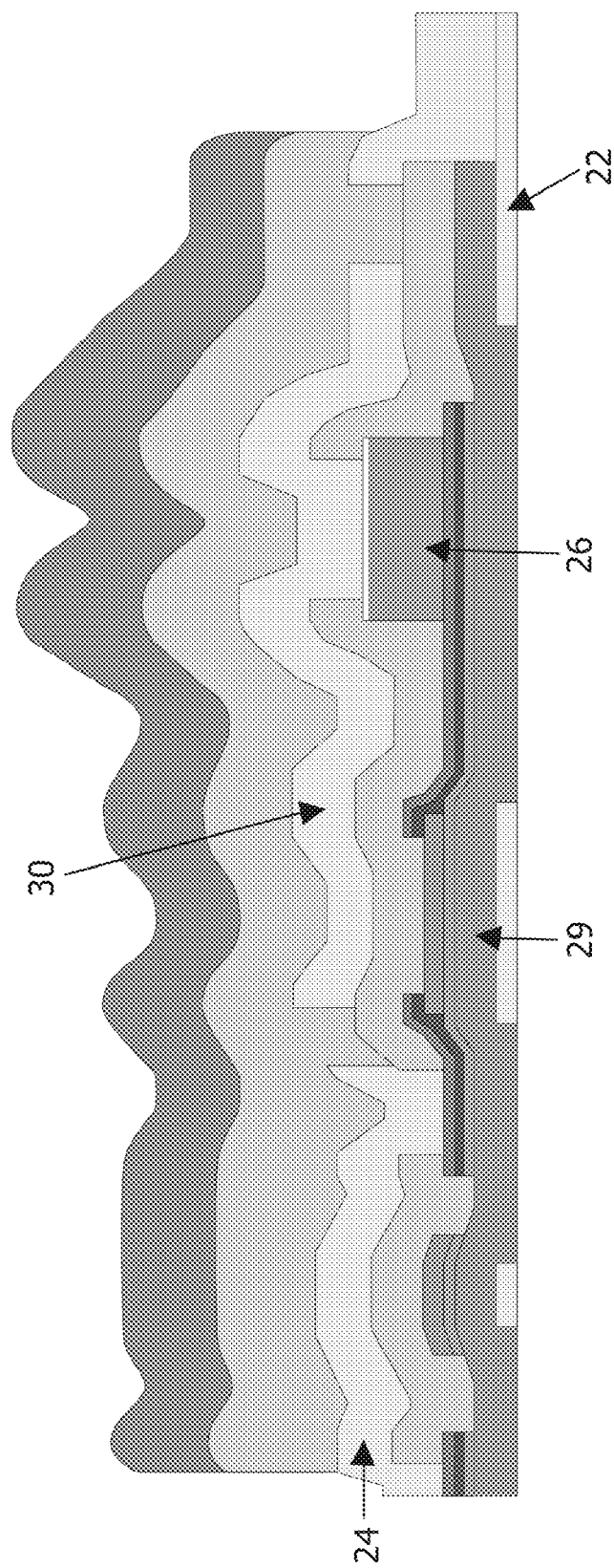
Figure 10:
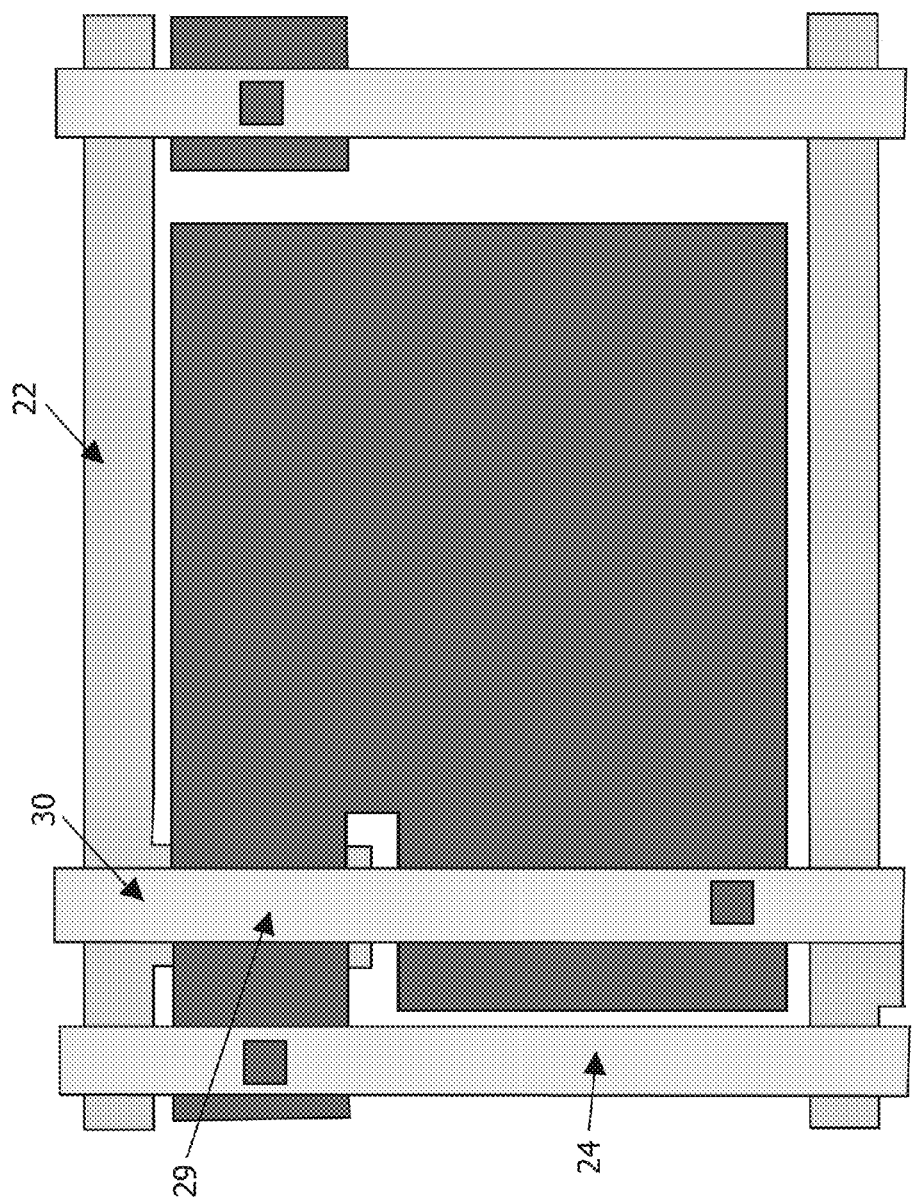

FIG. 9 shows in cross section an alternative planar TFT-photodiode technology, where the TFT connects to the bottom contact of the photodiode. The top contact of the photodiode is the common contact for all photodiodes. FIG. 10 shows the pixel layout in plan view. Again, the photodiode 26, data line 24, TFT 29, common electrode 30 and gate line 22 are shown.

Figure 11:
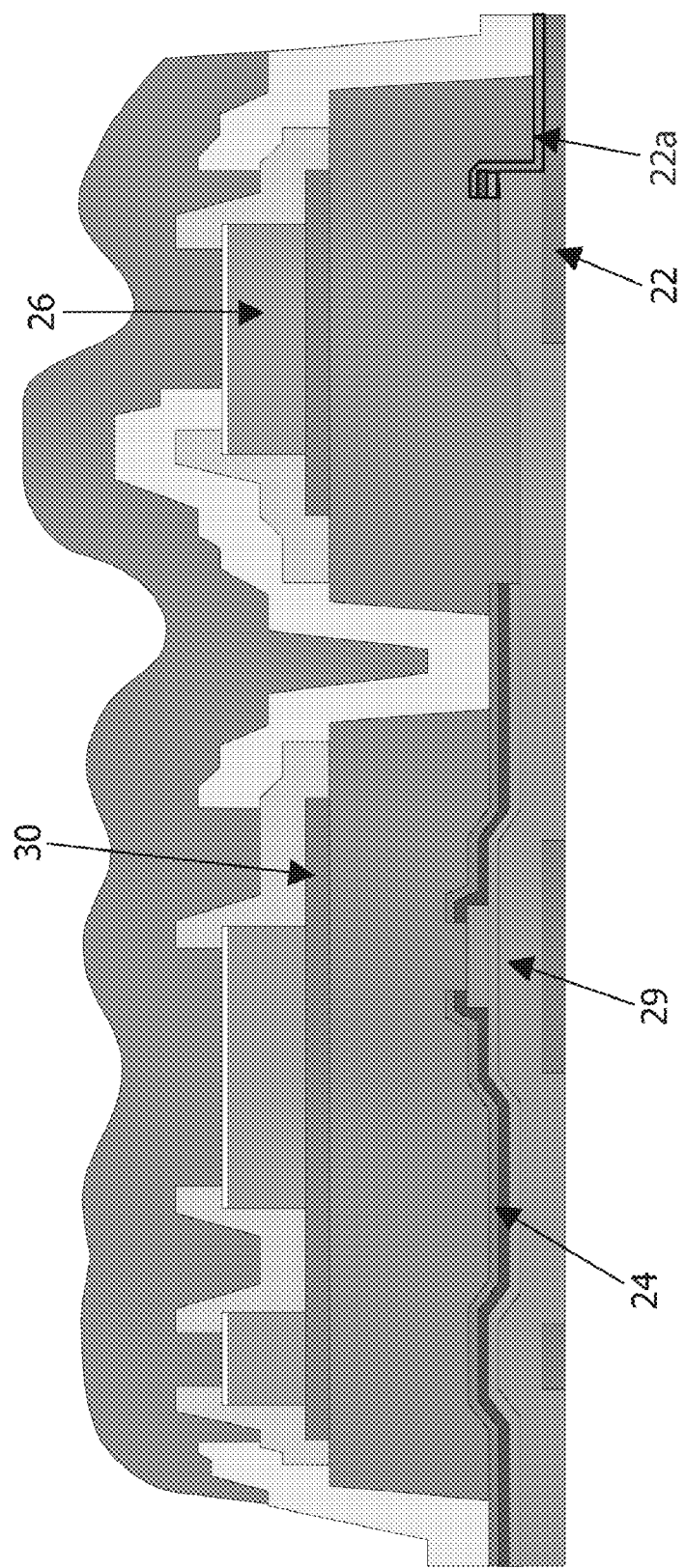
Figure 12:
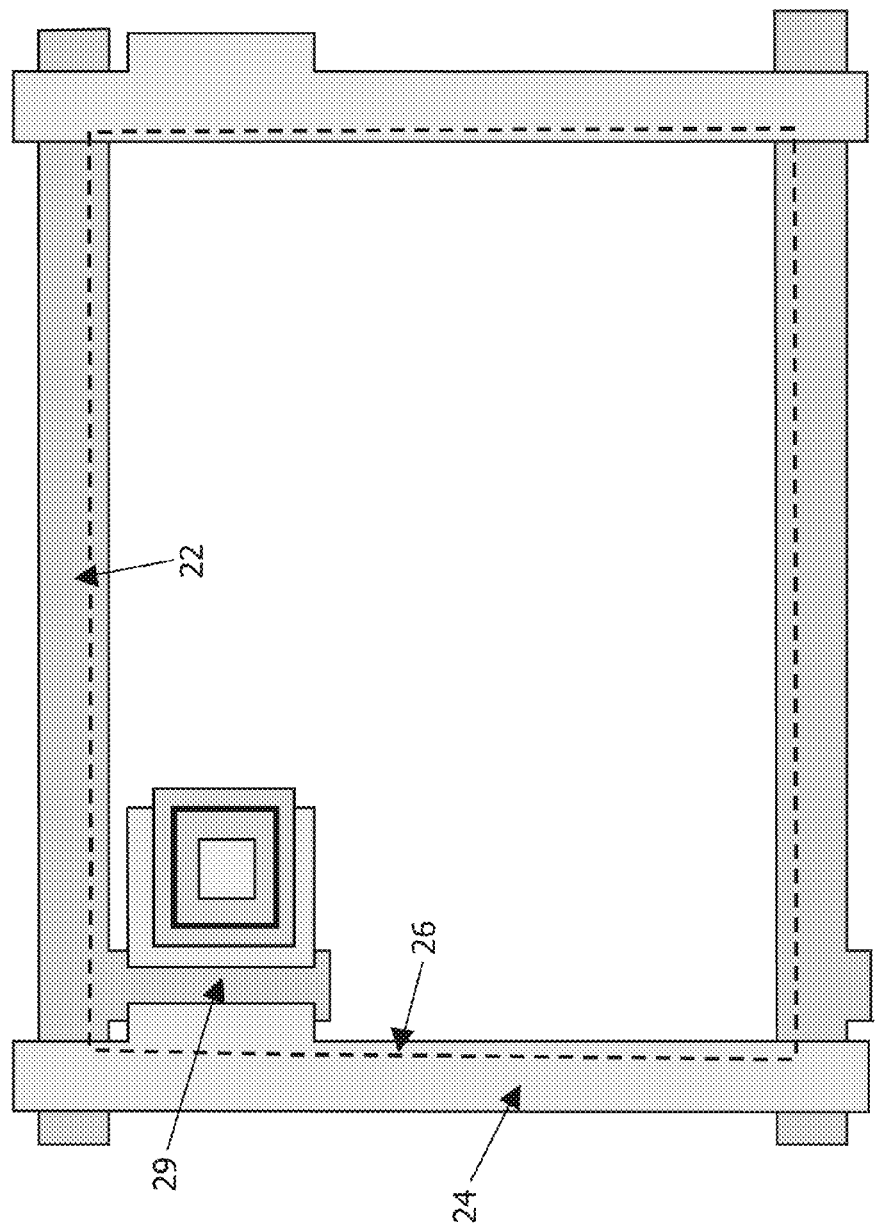

FIG. 11 shows in cross section a diode on top technology, and FIG. 12 shows the pixel layout in plan view (for a pixel without dose sensing). In this design, none of the layers of the TFT structure are used for the photodiode, which is instead formed over a planarisation layer. Connection is made to the TFT source or drain though a via in this layer. Again, the photodiode 26, data line 24, TFT 29, common electrode 30 and gate line 22 are shown.

A shunt connection 22a is required for a dose sensing version, and this shunt connection is shown in FIG. 11. A diode on top arrangement with dose sensing in shown in FIG. 17. The shunt connection 22a is the connection between the source-drain metal level and the gate metal level (labeled 'link for output pixel' in FIG. 17). This output link is only required on some pixels. A simpler process without shunt connection (one mask less) can be used for a detector without dose sensing.

Figure 13:
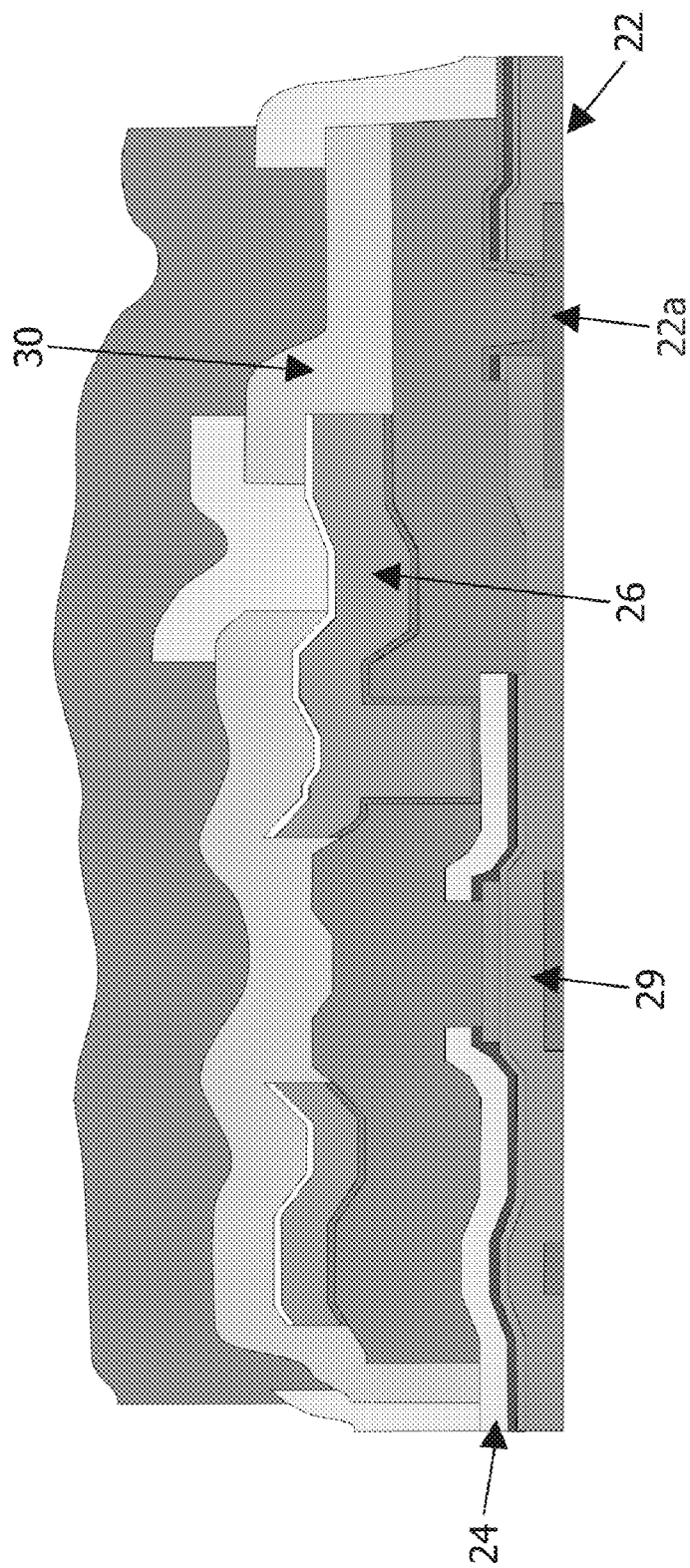
Figure 14:
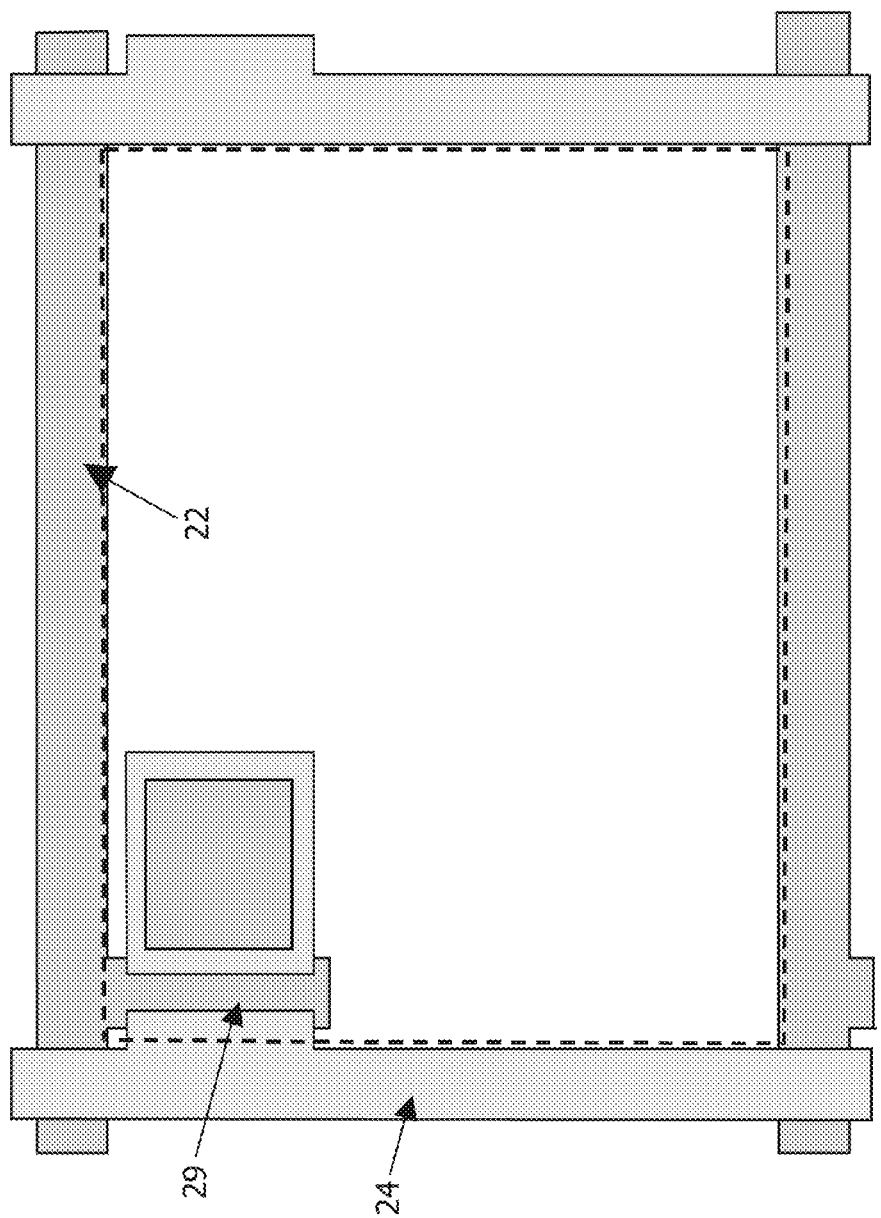

FIG. 13 shows in cross section an electrode on top with photodiode technology. The common electrode 30 connects to the top of the photodiode stack 26, and the bottom of the photodiode stack connects directly to the source or drain of the TFT 29. FIG. 14 shows the pixel layout in plan view (for a pixel without dose sensing).

A shunt connection 22a is again required for a dose sensing version, and this shunt connection is shown in FIG. 13. An electrode on top arrangement with dose sensing in shown in FIG. 18.

Figure 15:
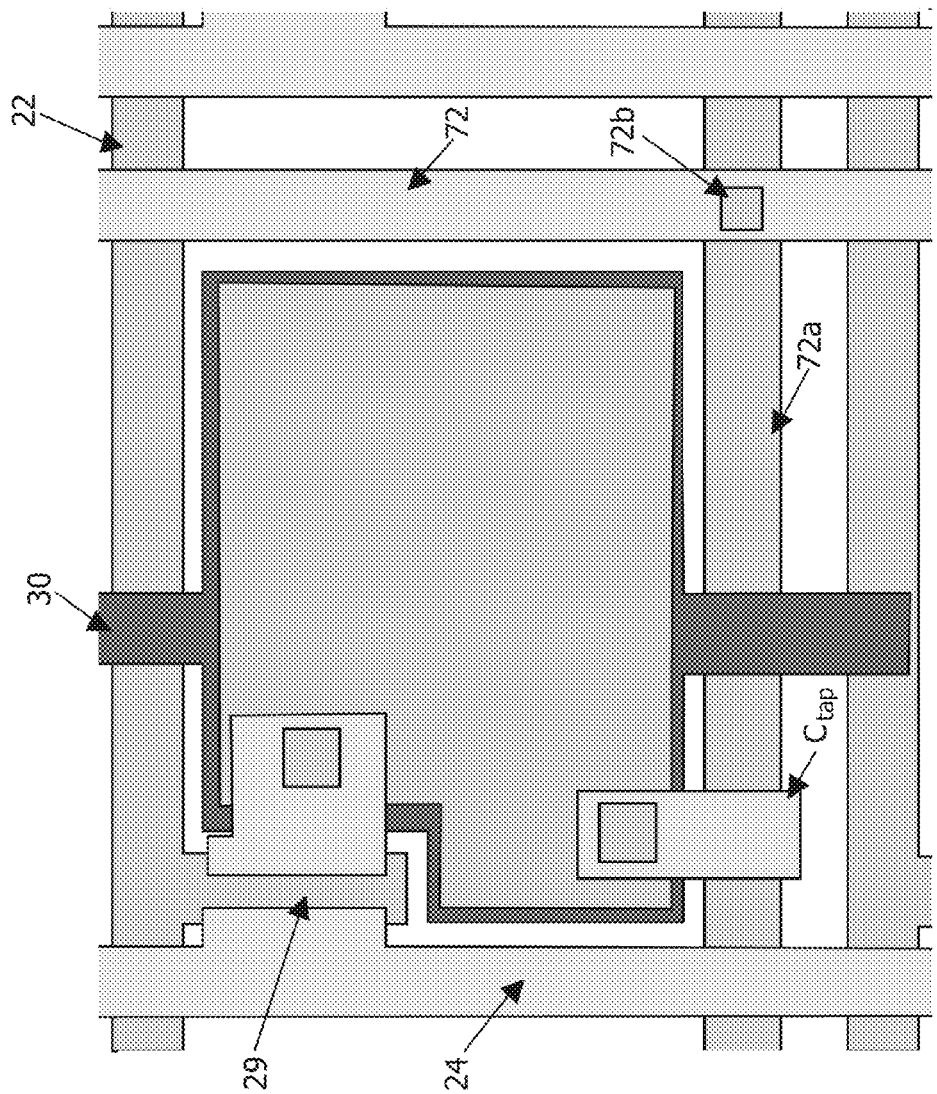
Figure 16:
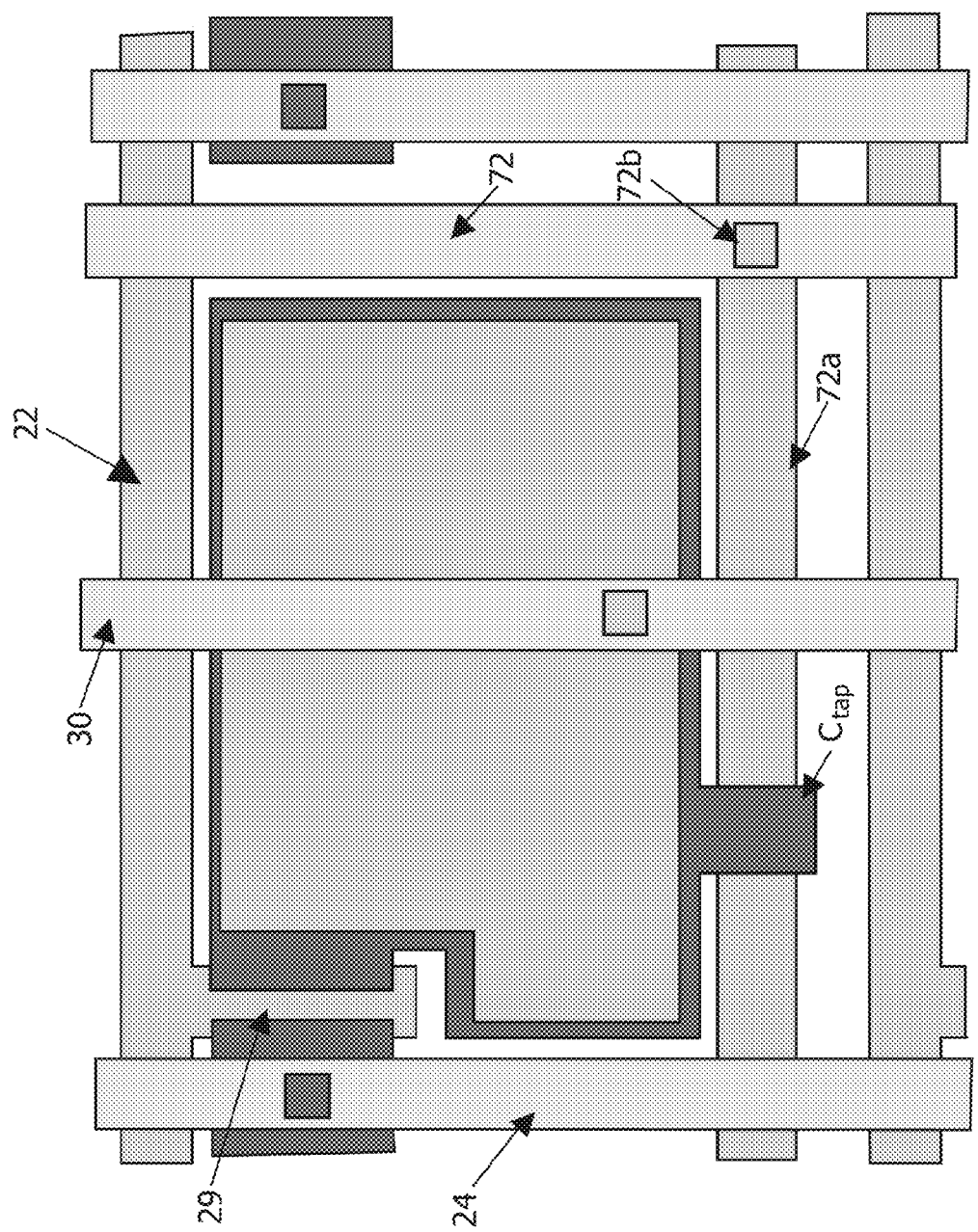

FIGS. 15 and 16 show integrated dose sensing implemented in the planar TFT-photodiode technologies of FIGS. 7, 8 and 9, 10 respectively, and using a dose sensing pixel having a tapping capacitor Ctap. In each case, the pixel layout is shown in plan view.

The dose sensing output line is shown as 72, and internal lines 72a are perpendicular to the dose sensing output line 72 for connecting together the dose sensing outputs from the pixels of a sub-array. Connection between the (higher) dose sensing output line 72 to the (lower) internal connection line 72a is by link 72b.

Figure 17:
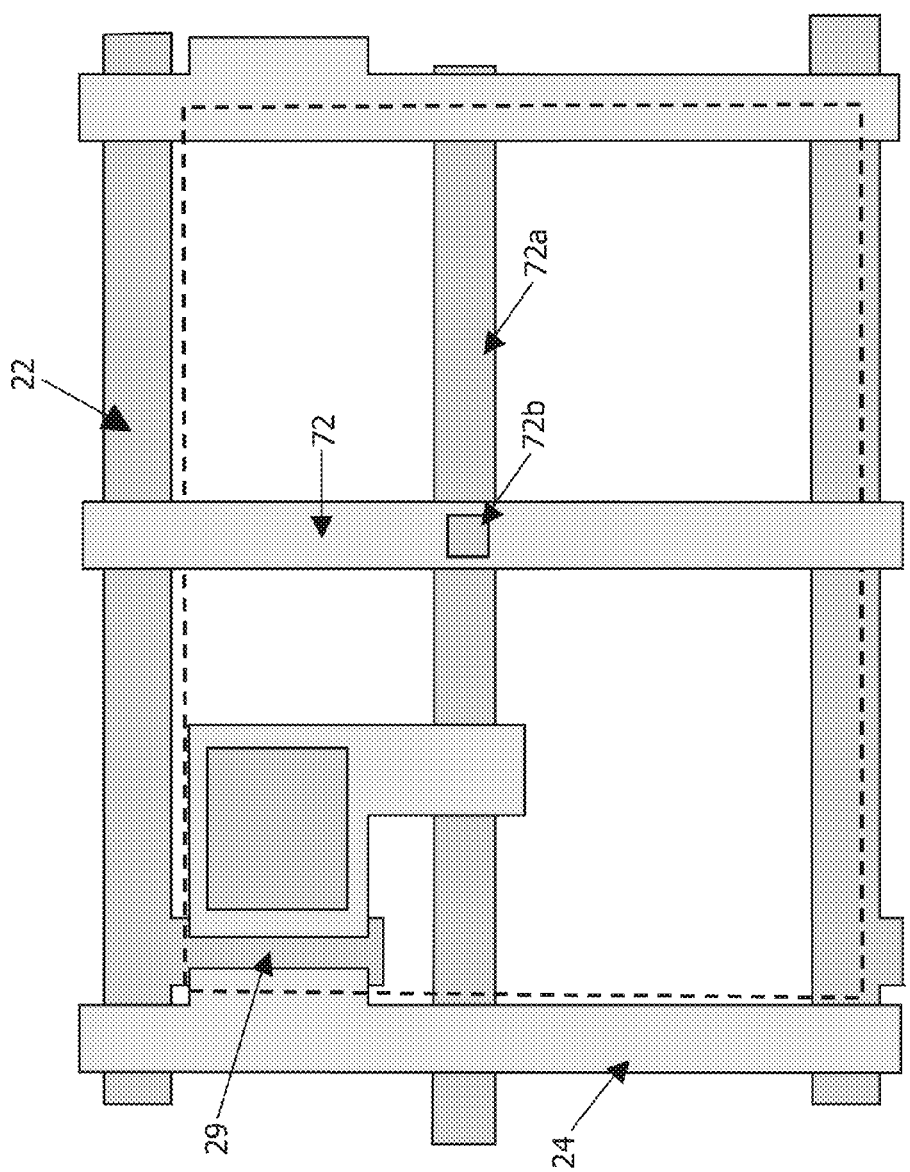

FIG. 17 shows integrated dose sensing implemented in the diode on top technology of FIG. 11. The dose sensing line 72 is a column conductor line, and the internal connections 72a are made using the row lines formed from the gate metal layer of the gate line 22. Again, connection between the (higher) dose sensing output line 72 to the (lower) internal connection line 72a is by link 72b.

Figure 18:
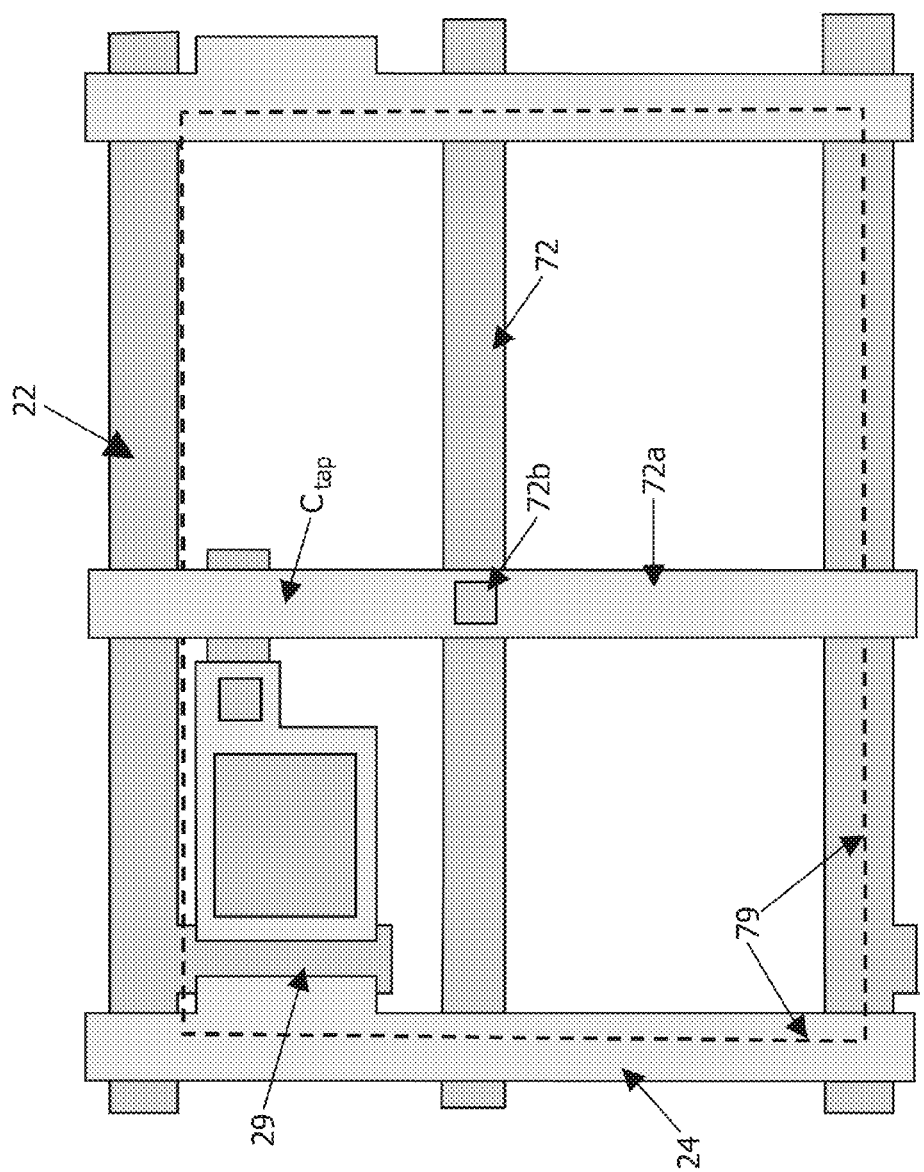

FIG. 18 shows integrated dose sensing implemented in electrode on top technology. The dose sensing line 72 is a row conductor formed from the gate metal layer of the gate line 22, and the internal connections 72a are formed as column lines, with link 72b. This leads to a lot of cross-talk, since the pixel electrode 79 is directly over the dose-sensing output line 72, which could come from other super-pixels, leading to high cross-talk.

The above technologies show photodiode implementations. The invention can also be applied to direct conversion pixel designs, and there are again many different technologies.

Figure 19:
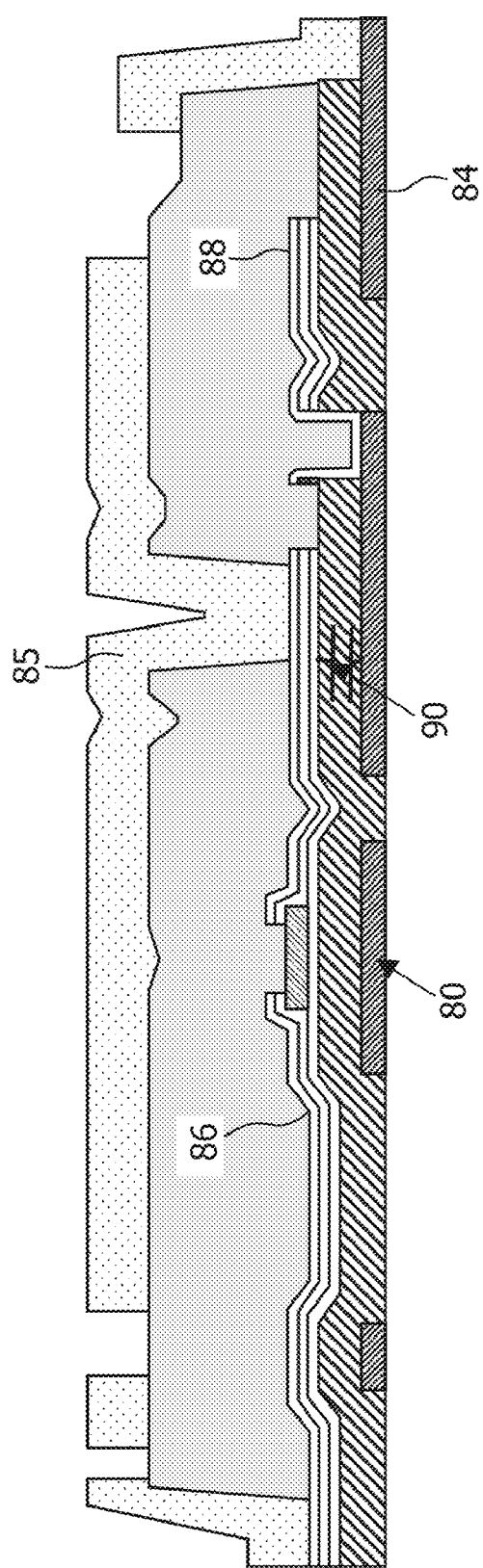

FIG. 19 shows an electrode on top technology for a direct conversion X-ray detector. The direct conversion element requires a capacitor 90, which is provided laterally of the TFTs (only one 80 shown in FIG. 7). FIG. 7 shows the gate metal layer 84, the read out line 86 formed in the source/drain metal and the common electrode 88. As above, in the electrode on top technology, the patterned pixel electrodes are at the top of the structure and connect through a via 85 to the source or drain of the TFT 80 as required. In this design, the readout lines 86 (which define the column electrodes) and the common electrode are defined by the source/drain metal layer, and the row conductors are defined by the gate metal layer.

When a tapping capacitor is used (FIG. 5), the dose sensing line 72 is formed by the gate metal layer, so that a capacitance can be defined between the pixel signal which is at the source/drain metal layer and the dose sensing line. Therefore, the dose sensing lines must then run parallel with the rows, and extend to the side edges of the pixel array. The internal connections between pixels in the sub-array to the common dose sensing line then run parallel to the column conductors and are made from the source/drain metal layer, as shown in FIG. 18.

When this tapping capacitance is not used and circuits of the type shown in FIGS. 3 and 4 are employed, the (shared) output line is typically provided as a column conductor formed from the source/drain metal layer, and the internal connections are defined using the gate metal layer.

Figure 20:
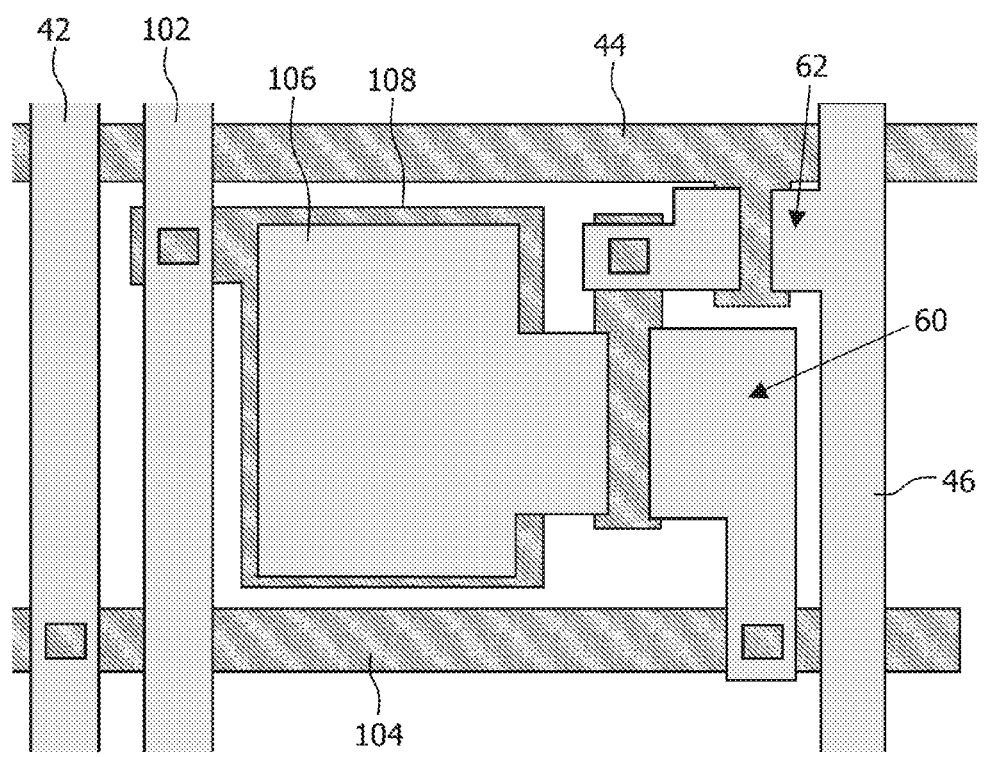

FIG. 20 shows a pixel design for this electrode on top technology, and shows a pixel with two transistors, and having a shared column detector and dose sensing line 42, corresponding to the pixel layout of FIG. 3 or 4.

In the case of direct conversion, a storage capacitor 106 is made between the gate metal layer (defining the lower common electrode 108) and the source-drain metal of the TFTs 60,62. The conversion layer is then provided over the top of the capacitor.

The common electrode 108 for each pixel in a column is connected to a column conductor 102, and these may themselves be connected together outside the pixel area.

The read out line 42 connects to all pixels within a sub-array by the internal connections 104 formed from in the gate metal layer and running in the row direction.

There is a stray capacitance between the output line 42 and the top pixel electrode and this gives rise to cross talk when the dose sensing line is for a neighbouring sub-array of pixels.

Figure 21:
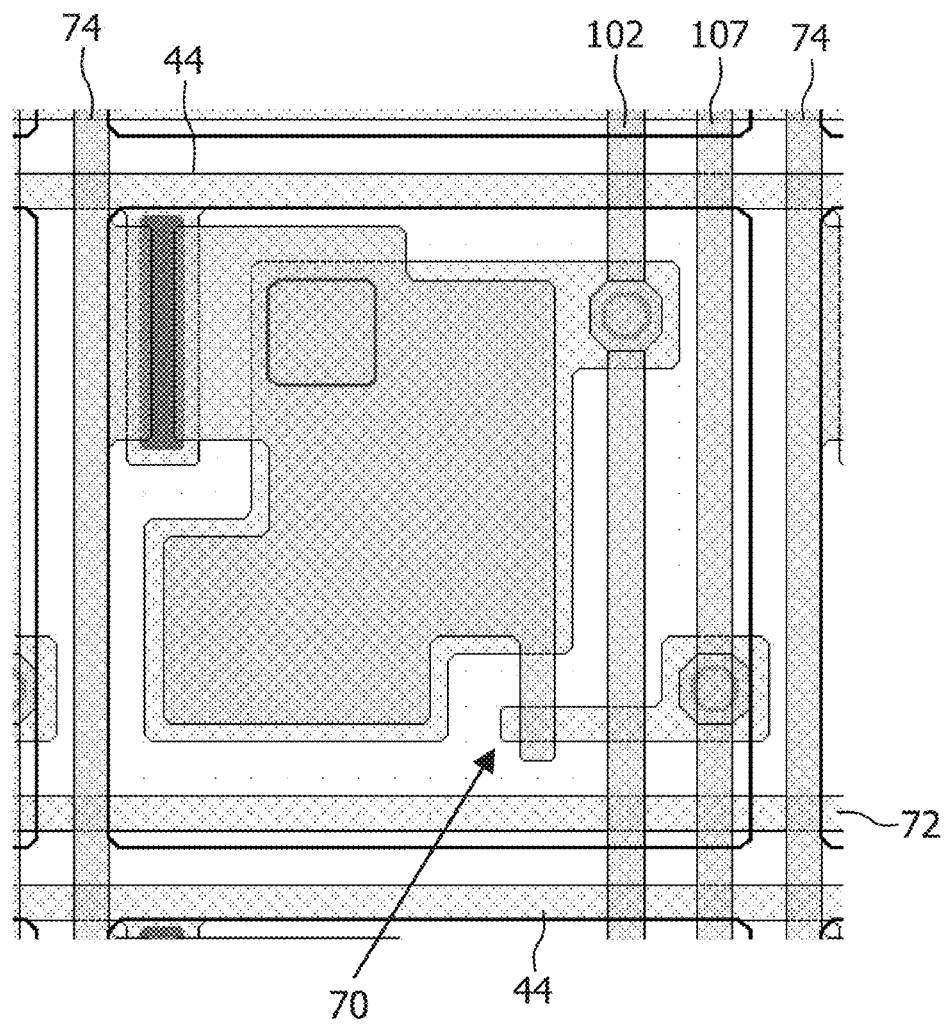

FIG. 21 shows a plan view of an electrode on top circuit for implementing the circuit of FIG. 5, with a single transistor and arranged to define a tapping capacitance. In this case, the dose sensing output 72 is provided in the row direction. The line 72 shown in FIG. 21 is for a different sub-array of pixels. The internal connection of the pixels in a sub-array to the common dose sensing line is by the connection lines 107 which are formed from the source/drain metal. As shown, internal connection line 107 for the pixel shown does not connect to the dose sensing output 72, but instead the internal connection is coupled to a different dose sensing output not shown in the Figure. The tapping capacitance 70 is defined at the cross over shown. FIG. 21 corresponds substantially to FIG. 18, but shows an additional column electrode 102 for connecting the common electrode terminals.

A stray capacitance between the line 72 and the overlying pixel electrode can again result in cross talk between the pixels in one sub-array and the dose sensing output from another sub-array.

Figure 22:
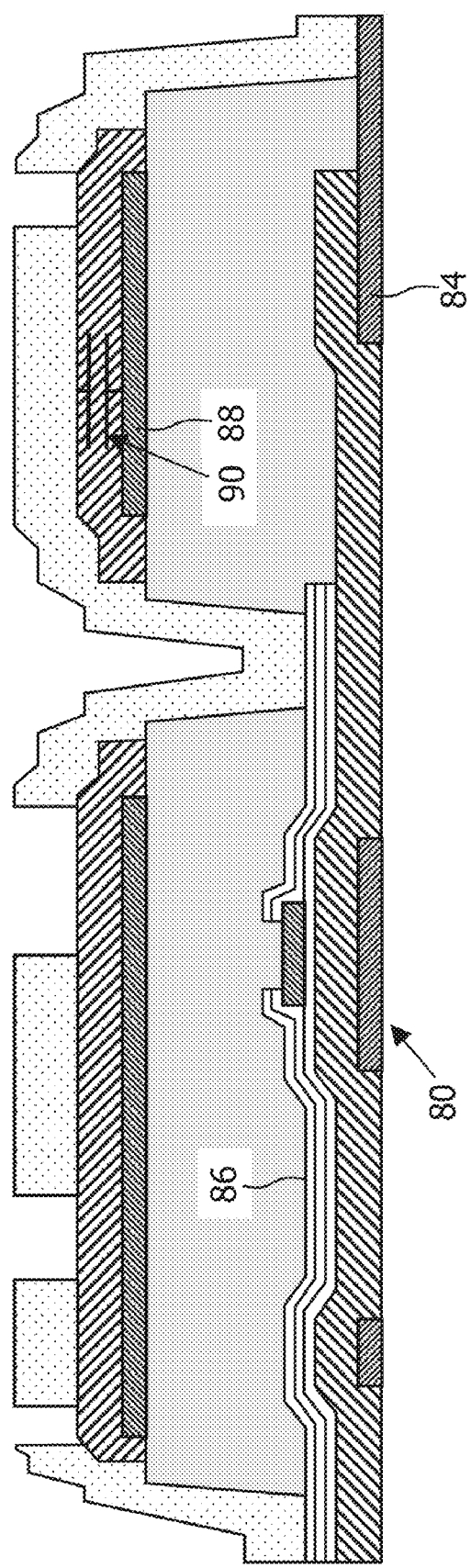

FIG. 22 shows a capacitor on top technology for a direct conversion X-ray detector. The capacitor 90 is provided above the TFTs. Only one TFT 80 is shown in FIG. 22. FIG. 22 also shows the gate metal layer 84, the read out line 86 and the common electrode 88. In this case, the common electrode 88 is spaced from the TFT by a dielectric layer, and the pixel electrode connects through this dielectric layer to the TFT.

In this case, when the circuit of FIG. 5 is to be implemented, the dose sensing line 72 is formed by the source/drain metal, and the dose sensing lines thus run parallel with the columns, and extend to the top and bottom edges of the pixel array. The internal connections of the pixels in the sub-array then run in the row direction and are formed from the gate metal layer. The tapping capacitor is then defined between the source drain metal layer, at which the pixel output is provided, and the underlying gate metal which forms the pixel connections to the output line.

There is again stray capacitance between the pixel electrode and the dose sensing output from a neighbouring sub-array of pixels.

Figure 23:
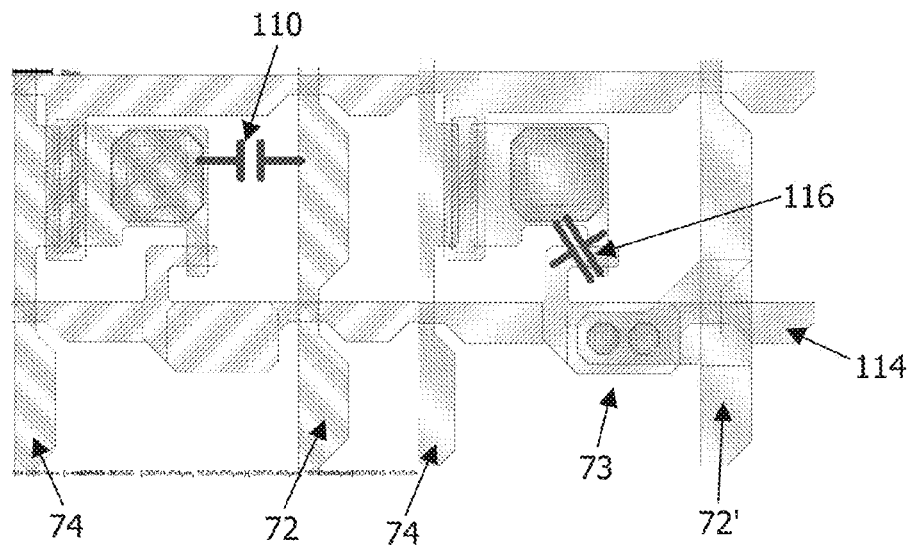

FIG. 23 shows in plan view a single TFT pixel with tapping capacitor using capacitor on top technology, and is used to explain the problem of stray capacitances.

The stray capacitance is shown as 110 between the dose sensing line 72 of one sub-array of pixels and the pixel electrode of the pixels in another sub-array through which the dose sensing line 72 passes. 72' represents the dose sensing output for the two pixels shown and 114 represents the internal pixel connections to the dose sensing output, formed from the gate metal layer. The connection between the dose sensing line 72' and the internal connection 114 is shown at 73. The tapping capacitor (of FIG. 5) is shown as 116 and is defined between the source drain metal layer and the internal pixel connection line 114.

In its first aspect, the invention provides a plurality of additional screening electrodes for the output conductors to which the dose sensing signals are provided, with a screening electrode substantially adjacent the dose sensing output conductor for each sub-array of pixels. The invention can be applied to pixels in which the dose sensing output conductor provides also the image sensor readout or in which separate image sensor readout lines and dose sensing lines are provided.

Figure 24:
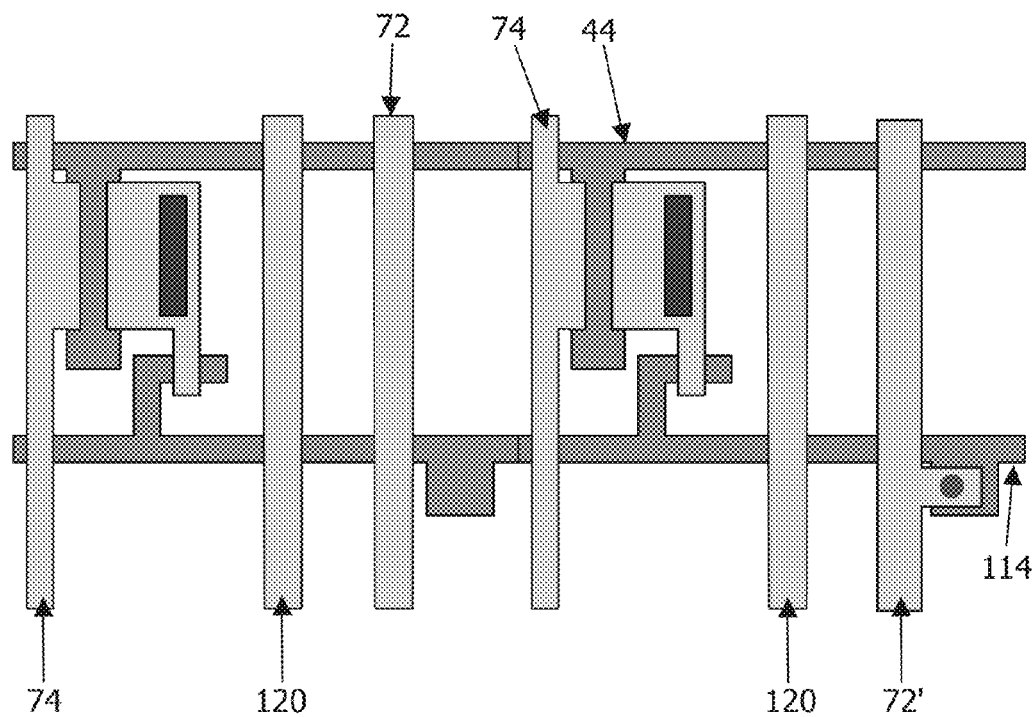
FIG. 24 shows in plan view a first pixel arrangement of the invention for implementation using capacitor on top technology, and for a pixel of the type shown in FIG. 5.

FIG. 24 shows in plan view a first pixel arrangement of the invention for implementation using capacitor on top technology, and for a pixel of the type shown in FIG. 5. The same reference numerals are used as in FIG. 23 and description is not repeated.

As shown, each dose sensing line 72,72' has an adjacent and parallel screening line 120, formed from the same material layer. In this way, each dose sensing line 72 is sandwiched between a screening electrode 120 and an output electrode 74, and all three run parallel, in the column direction in the example of FIG. 12.

Figure 25:
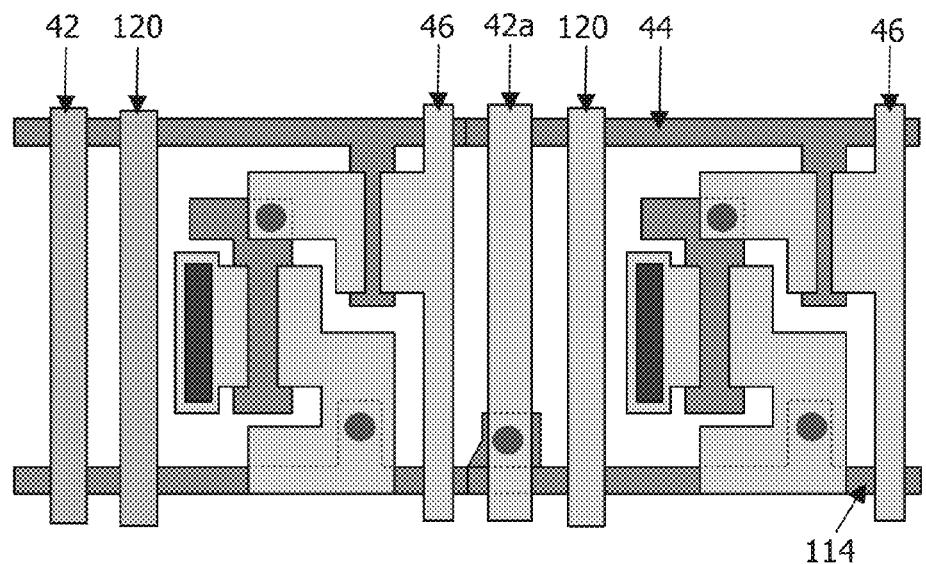
FIG. 25 shows in plan view a second pixel arrangement of the invention for implementation using capacitor on top technology, and for a pixel of the type shown in FIGS. 3 and 4.

FIG. 25 shows in plan view a second pixel arrangement of the invention again for implementation using capacitor on top technology, and for a pixel of the type shown in FIGS. 3 and 4. Thus, each pixel has two TFTs.

Again, each shared dose sensing line/output line 42,42a has an adjacent and parallel screening line 120, formed from the same material layer. Again, each dose sensing/output line 42,42a is sandwiched between a screening electrode 120 and a drive electrode 46, and all three run parallel, in the column direction in the example of FIG. 25. 42a is the shared dose sensing line/output line to which the shown pixels are connected and 42 is a dose sensing line/output line for a different sub-array of pixels.

Figure 26:
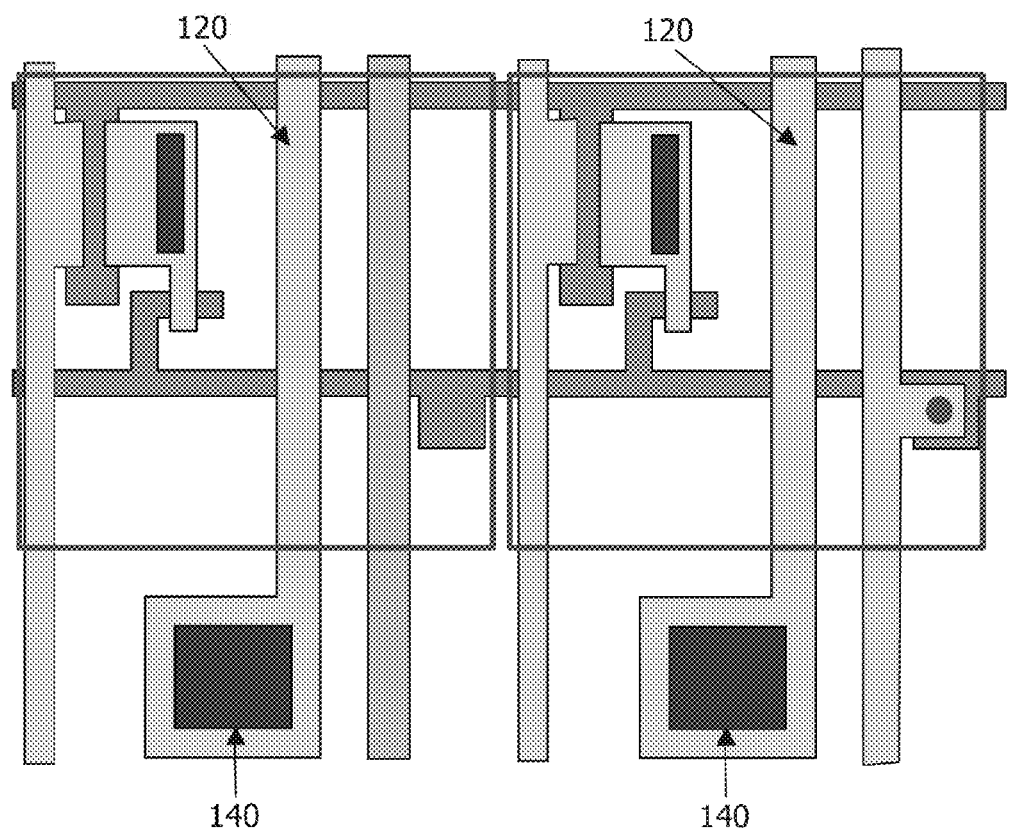
FIG. 26 shows the connections between the pixels of FIG. 24.

FIG. 26 shows how the screening electrodes 120 of the layout of FIG. 24 can connect through vias 140 to a common metal electrode on top of the interlayer dielectric, namely layer 88 shown in FIG. 22.

Figure 27:
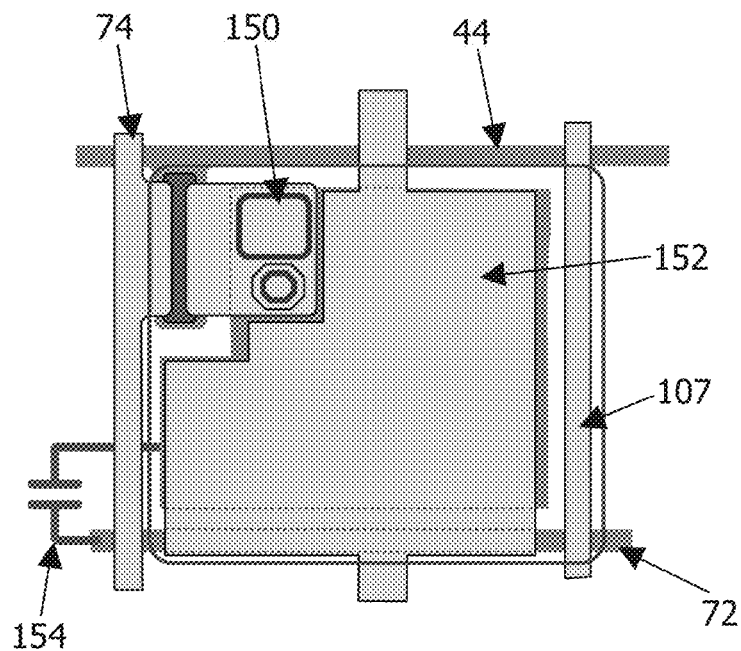
FIG. 27 shows in plan view a third pixel arrangement of the invention for implementation using electrode on top technology, and for a pixel of the type shown in FIG. 5.

FIG. 27 shows in plan view an arrangement of a second aspect of the invention for implementation using electrode on top technology, and for a pixel of the type shown in FIG. 5.

FIG. 27 comprises an improvement to the conventional layout of FIG. 21. In FIG. 27, shielding between the top pixel electrode and the dose sensing line for a different sub-array of pixels is provided using a different form of screening.

In FIG. 27, the source/drain metal layer is instead used to define a shielding structure 152 which overlaps the dose sensing line. This acts as a shield between the dose sensing line 72 and the top pixel electrode The shielding structure is at a fixed potential for all pixels, and FIG. 27 shows that the shielding structure for columns of pixels can be continuous. Thus, the source/drain metal layer is patterned into the output electrodes 74, the shielding structure 152 and the internal connections 107 to the dose sensing line. These three components of the source/drain layer are all parallel and in the column direction in the example of FIG. 27.

Figure 29:
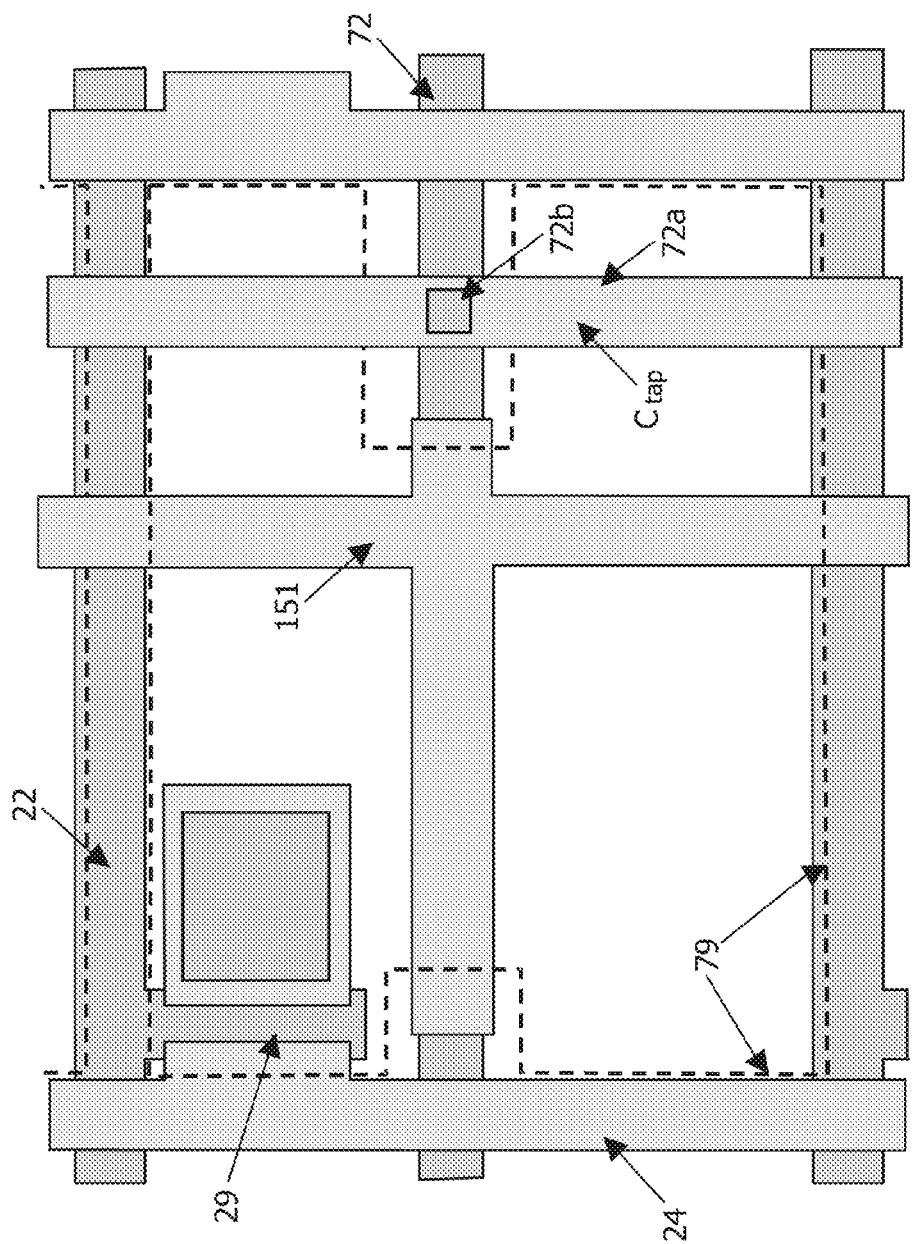
FIG. 29 shows in plan view a fourth pixel arrangement of the invention for implementation using electrode on top technology, and for a pixel of the type shown in FIG. 5.

FIG. 27 shows one version of 'electrode on top' technology, which is for direct conversion, with no photodiode. Electrode 152 is the common electrode. For an 'electrode on top' technology with photodiode, the common electrode must be on top of the photodiode, though a separate shielding electrode can be in the source-drain metal, as shown in FIG. 29. In FIG. 27 vias are shown as 150 and these are for making connections up to the pixel electrode and down to the bottom metal of the storage capacitor.

The tapping capacitor in this design no longer needs to be defined by a dedicated crossover as in FIG. 21. Instead, the tapping capacitor can be defined between the internal connection 107 and the pixel electrode, with the upper polymer layer over which the pixel electrode is provided as the dielectric. Eliminating the need for a cross over removes one source of yield defects.

The design of FIG. 27 also avoids the need for a separate column electrode (102 in FIG. 21) to connect all of the common electrode terminals of the pixels in a column together. The number of vias required through the gate insulator is also reduced because there is no longer any column electrode formed from the gate metal layer.

One source of stray capacitance remains in FIG. 27, and this is shown as 154, and comprises lateral capacitive coupling between the dose sensing output line 72 and pixel electrode, since the pixel electrode is connected to the large area of bottom metal of the storage capacitor.

Figure 28:
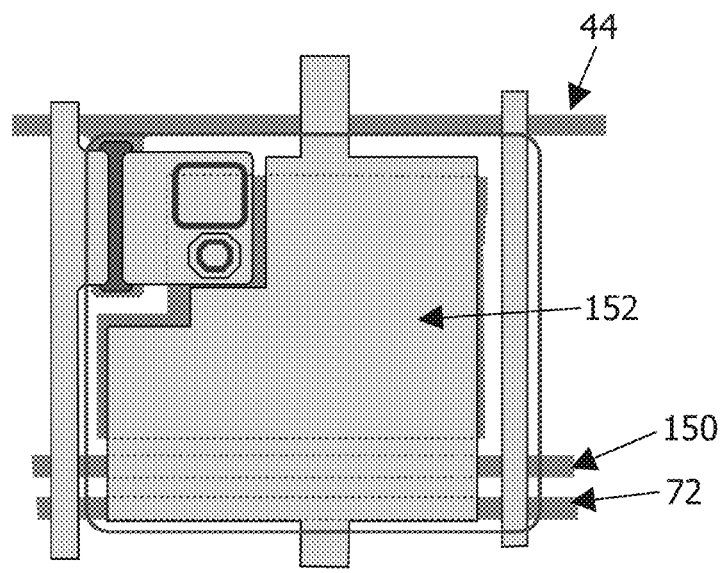
FIG. 28 shows a modification to the pixel arrangement of FIG. 27.

In FIG. 28, the screening electrodes 150 formed from the source/drain metal layer are again provided as shown. These run in the row direction and are thus parallel to the dose sensing lines 72. Each dose sensing line 72 is thus sandwiched between a screening electrode 150 and a row conductor 44, and these three conductors are formed from the same metal layer and parallel to each other.

FIG. 29 shows a further example of the invention for a photodiode pixel, and in which a separate screening electrode 151 is provided which is shaped for accurately overlying the dose sensing line 72. This figure represents the implementation of the invention to the structure of FIG. 18, namely electrode on top technology for a photodiode (rather than direct conversion) pixel structure. The screening electrode 151 structure is not connected to other parts of the pixel structure but is formed from the same layer as the column data lines 24 and internal dose sensing lines 72a of the pixels. The shielding layer 151 overlies most of the dose sensing output line 72 which was exposed in FIG. 18. A tapping capacitor Ctap is assumed to be provided by direct overlap through the thick dielectric to the pixel electrode 79. However a separate tapping capacitor, as shown in FIG. 18 could still be used.

Figure 30:
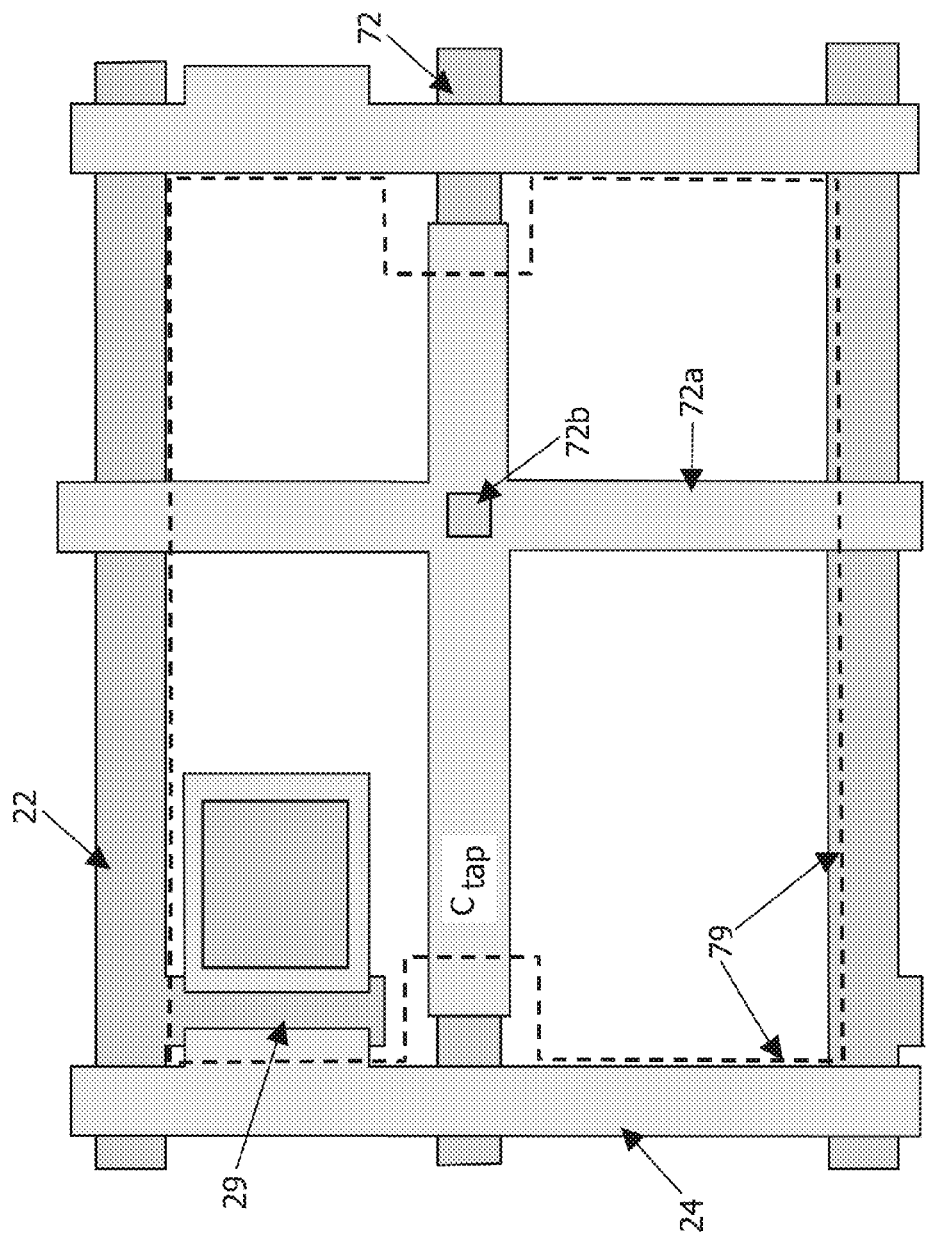
FIG. 30 shows a modification to the pixel arrangement of FIG. 29.

FIG. 30 again shows the implementation of the invention to the structure of FIG. 18, namely electrode on top technology for a photodiode pixel structure, but with the dose sensing internal line 72a used as the screening electrode (and thus avoiding the need for the separately patterned structure 151 of FIG. 29). Again, the shielding layer 72a overlies most of the dose sensing output line 72 which was exposed in FIG. 18. This implementation eliminates one line and associated cross-overs. Again, a separate tapping capacitor, as in FIG. 18 could still be used. The pixel electrode 79 is shaped to avoid any direct overlap of the dose sensing output line with the pixel electrode, so that the parts of the dose sensing output line which do remain exposed are not covered by the pixel electrode.

A large number of different technologies are shown above. The invention can be used to modify these different technologies in different ways. The invention can be implemented as additional vertical screening electrodes, additional horizontal screening electrodes and as screening electrodes using the vertical dose sensing internal line, in particular when the dose sensing output line is the lowest metal.

These different approaches are each suited to one or more of the different technologies available, namely planar TFT-photodiode, diode on top, electrode on top (for direct conversion or photodiode pixel types) and capacitor on top. The invention can be applied to pixel configurations in which dose sensing pixel sub-arrays are implemented by means of twin-TFT multiplexing pixels as well as tapping capacitor pixels which require only one TFT.

The use of the dose sensing internal electrode as a screening electrode is particularly suitable for the implementation of a photodiode pixel using electrode on top technology, where the common electrode is constrained to be on top of the photodiode. In electrode on top, capacitor on top and diode on top technology, there is already a conveniently positioned common electrode, which can act as a screen (for example as in FIG. 27).

As explained above, the exposure control is preferably carried out to provide the best image contrast for an area of the image of particular interest. Therefore, it is possible for a processing unit to analyse a particular pattern of sub-arrays of interest for the particular X-ray examination taking place.

Furthermore, different weights can be assigned to certain dose sensing pixel sub-arrays to obtain a weighted dose signal and dose rate signal.

The dose sensing signals can be analysed in the analogue domain or after sampling to obtain exposure information. When a given condition has been reached, analysis of the sampled outputs results in termination of the X-ray exposure period which is followed by the read out stage. The X-ray exposure may be pulsed, and the exposure control then dictates when the X-ray exposure ceases.

In the examples described above, the dose sensing pixels are shown schematically, in each case, as forming a block of 4×4 pixels. Of course, this is not necessarily the case, and in fact the dose sensing pixels will be grouped in much larger groups. Of course, the array will not necessarily have the same number of rows and columns, and indeed the pixel blocks which share a common dose sensing signal output will not necessarily be square.

The manufacturing processes involved in forming the solid state device have not been described in detail. The pixel configuration of the invention can be achieved using the thin film techniques applied for conventional cells. Typically, such devices are amorphous or polycrystalline silicon devices fabricated using thin film techniques.

Various modifications will be apparent to those skilled in the art.

The invention claimed is:

1. An X-ray detector apparatus (14) comprising an array of detector pixels (20), each pixel comprising a conversion element (26,260) for converting incident radiation into a charge flow, a charge storage element (28) and a switching arrangement (50) enabling the charge stored to be provided to an output of the pixel, wherein the array of pixels is arranged into a plurality of sub-arrays (40), each sub array (40) comprising a plurality of pixels, the pixels in each sub-array sharing a common dose sensing output provided to a dose sensing output conductor (42;72) which extends to a periphery of the pixel array, wherein the dose sensing output conductor (42; 72) for one sub-array of pixels passes through the area occupied by another sub-array of pixels, wherein a plurality of additional screening electrodes (120) are provided, with a screening electrode (120) substantially adjacent the dose sensing output conductor (72) for each sub-array of pixels.

2. Apparatus as claimed in claim 1, wherein the screening electrodes (120) are formed from the same process layer or layers as the dose sensing output conductors (72).

3. Apparatus as claimed in claim 2, wherein each dose sensing output conductor (72) is sandwiched between a screening electrode (120) and a further electrode (74), the dose sensing output conductor (72), screening electrode (120) and further electrode (74) being parallel to each other and formed from the same process layer or layers.

4. Apparatus as claimed in claim 1, wherein the pixels are arranged in rows and columns, and the dose sensing output conductors (72) extend in a column direction.

5. Apparatus as claimed in claim 4, wherein the dose sensing output conductors (72) also function as the detector output conductors.

6. Apparatus as clamed in claim 5, wherein the detector apparatus is operable in two modes, a first mode in which charge flow in response to incident radiation is partially coupled to the dose sensing output (72) for measurement as a dose sensing signal, and a second mode in which charge flow is coupled through a pixel switching arrangement (50) between the charge storage element and the dose sensing output for measurement as a detection signal, and wherein the switching arrangement (50) is turned on by first and second control signals which enable a single pixel within the sub-array to be selected.

7. Apparatus as claimed in claim 1, wherein the pixels are arranged in rows and columns, and the dose sensing output conductors (72) extend in a row direction.

8. Apparatus as claimed in claim 7, wherein detector output conductors (24;74) are provided which extend in a column direction.

9. Apparatus as claimed in claim 1, wherein the screening electrodes (120) are all electrically connected together.

10. Apparatus as claimed in claim 9, wherein the screening electrodes (120) are all electrically connected together (140) outside the pixel array.

11. Apparatus as claimed in claim 1, wherein a pixel electrode (79) for each pixel is formed at an upper region of the array, and the dose sensing output conductors (72) are formed at a lower region of the array, and wherein each pixel further comprises an intermediate conductor layer (72a;151) which overlaps the dose sensing output conductors (72) for other sub-arrays of pixels and which pass through the area occupied by the sub-array of pixels.

12. Apparatus as claimed in claim 11, wherein the dose sensing output (72) is formed from a layer which also forms row address conductors (22;44).

13. Apparatus as claimed in claim 11, wherein the intermediate conductor layer is formed from a layer which also forms the detector output conductors (24;46).

14. Apparatus as claimed in claim 1, further comprising a conversion layer for converting an incident X-ray signal into an optical signal, and wherein the conversion element comprises an optical sensor.

15. Apparatus as claimed in claim 14, wherein the optical sensor comprises a photodiode (26).

16. Apparatus as claimed in claim 14, wherein the charge storage element comprises the photodiode (26), which stores a charge due to the self-capacitance thereof.

17. Apparatus as claimed in claim 1, wherein the conversion element comprises a photoconductor.

18. Apparatus as claimed in claim 1, wherein a read out amplifier (36) is provided for each sub-array of pixels.

19. An X-ray detector apparatus (14) comprising an array of detector pixels, each pixel comprising a conversion element (26;260) for converting incident radiation into a charge flow, a charge storage element (28) and a switching arrangement (50) enabling the charge stored to be provided to an output of the pixel, wherein the array of pixels is arranged into a plurality of sub-arrays (40), each sub array comprising a plurality of pixels, the pixels in each sub-array sharing a common dose sensing output provided to a dose sensing output conductor (42;72) which extends to a periphery of the pixel array, wherein the dose sensing output conductor (72) for one sub-array of pixels passes through the area occupied by another sub-array of pixels, wherein each pixel further comprises a pixel electrode (79) for each pixel formed at an upper region of the array, and the dose sensing output conductors (72) are formed at a lower region of the array, wherein each pixel further comprises an intermediate conductor layer (72a;151) which overlaps the dose sensing output conductors (72) for other sub-arrays of pixels and which pass through the area occupied by the sub-array of pixels.

20. Apparatus as claimed in claim 19, wherein the pixels are arranged in rows and columns, and the dose sensing output conductors (72) extend in a row direction.

21. Apparatus as claimed in claim 20, wherein detector output conductors (24;42;74) are provided which extend in a column direction.

22. Apparatus as claimed in claim 21, wherein the dose sensing output (72) is formed from a layer which also forms row address conductors (22;44).

23. Apparatus as claimed in claim 21, wherein the intermediate conductor layer (72a;151) is formed from a layer which also forms the detector output conductors (24;42;74).

24. Apparatus as claimed in claim 19, wherein a plurality of additional screening electrodes (120) are provided, with a screening electrode (120) substantially adjacent the dose sensing output conductor (72) for each sub-array of pixels.

25. Apparatus as claimed in claim 19, wherein each sub-array of pixels further comprises internal connections (72a) which couple each pixel to the dose sensing output (72) through a tapping capacitance (Ctap), and wherein the tapping capacitance is defined between the internal connections (72a) and the pixel electrodes (79).

26. Apparatus as claimed in claim 25, wherein the internal connections (72a) are defined by the intermediate conductor layer.

27. Apparatus as claimed in claim 19, wherein each sub-array of pixels further comprises internal connections (72a) which couple each pixel to the dose sensing output (72), and wherein the internal connections (72a) are defined by the intermediate conductor layer.

28. Apparatus as claimed in claim 19, wherein the conversion element of each pixel comprises a photodiode (26).

29. An X-ray examination apparatus comprising:
   an X-ray source (10) for exposing an object (12) to be examined to X-ray energy; and
   an X-ray detector (14) as claimed in claim 19, for receiving an X-ray image after attenuation by the object to be examined.

\* \* \* \* \*